United States Patent
Kawauchi et al.

(10) Patent No.: US 7,033,725 B2
(45) Date of Patent: Apr. 25, 2006

(54) INFRARED-SENSITIVE PHOTOSENSITIVE COMPOSITION

(75) Inventors: Ikuo Kawauchi, Shizuoka (JP); Takeshi Serikawa, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/305,003

(22) Filed: Nov. 27, 2002

(65) Prior Publication Data

US 2003/0198888 A1    Oct. 23, 2003

(30) Foreign Application Priority Data

Nov. 30, 2001   (JP) .......................... P2001-367009
Dec. 13, 2001   (JP) .......................... P2001-380184

(51) Int. Cl.
*G03F 7/004*    (2006.01)

(52) U.S. Cl. .................. 430/270.1; 430/281.1; 430/284.1; 430/288.1; 430/964

(58) Field of Classification Search ........... 430/270.1, 430/281.1, 284.1, 285.1, 286.1, 287.1, 288.1, 430/302, 964
See application file for complete search history.

(56) References Cited

U.S. PATENT DOCUMENTS

| | | | |
|---|---|---|---|
| 3,628,953 A | 12/1971 | Brinckman | |
| 5,840,467 A | 11/1998 | Kitatani et al. | |
| 6,183,935 B1 * | 2/2001 | Hanabata et al. | 430/270.1 |
| 6,509,133 B1 * | 1/2003 | Watanabe et al. | 430/270.1 |
| 6,558,869 B1 * | 5/2003 | McCullough et al. | 430/270.1 |
| 2001/0026902 A1 * | 10/2001 | Hirano et al. | 430/272.1 |

FOREIGN PATENT DOCUMENTS

| | | |
|---|---|---|
| EP | 0 543 264 A1 | 5/1993 |
| EP | 1 112 843 A2 | 7/2001 |
| EP | 1 136 255 A2 | 9/2001 |
| EP | 1 195 646 A1 | 4/2002 |
| EP | 1 234 662 A2 | 8/2002 |
| JP | 46-27919 | 8/1971 |
| JP | 56-69192 | 6/1981 |
| JP | 7-285275 | 10/1995 |
| WO | WO 99/21725 * | 5/1999 |

* cited by examiner

*Primary Examiner*—Barbara L. Gilliam
(74) *Attorney, Agent, or Firm*—Sughrue Mion, PLLC

(57) ABSTRACT

An infrared-sensitive photosensitive composition comprising (A) an alkali-soluble resin containing a repeating unit having an alkylene oxide group, and (B) a light-to-heat converting agent; and an infrared-sensitive photosensitive composition comprising (A') a polyurethane resin having a specific diol as a constituent, (B) a light-to-heat converting agent, and (C) a novolak resin.

3 Claims, No Drawings

INFRARED-SENSITIVE PHOTOSENSITIVE COMPOSITION

FIELD OF THE INVENTION

The present invention relates to an infrared-sensitive photosensitive composition, in particular, relates to an infrared-sensitive photosensitive composition for use in the image-forming layer of a positive lithographic printing plate precursor for so-called direct plate-making capable of directly plate-making from digital signals such as computer data.

BACKGROUND OF THE INVENTION

As the system of directly plate-making from digital signals such as computer data, systems by (1) electrophotography, (2) photopolymerization by combination of exposure by Ar laser and post-heating, (3) lamination of a silver salt photosensitive material on a photosensitive resin, (4) a silver master type, and (5) breakdown of a silicone rubber layer by discharge breakdown and laser beams are known.

However, a method of using electrophotography of (1) is complicated in processes such as electrification, exposure and development, and requires intricate and large-scaled equipment. A method (2) requires highly sensitive printing materials over and above a post-heating process, and handling in daylight is difficult. Since methods (3) and (4) use silver salts, processing is complicated and uneconomical. A method (5) is a method of comparatively reaching completion, but a problem of the elimination of silicone residues on a plate remains. On the other hand, the development of laser in recent years is remarkable, in particular, small-sized solid state lasers and semiconductor lasers having emission regions in near infrared to infrared of high output are easily available. Laser is very useful as the exposure light source of direct plate-making from digital signals such as computer data.

As conventional lithographic printing plate materials, Japanese Patent Publication No. 27919/1971 discloses a method of forming an image by heating according to data a printing material containing a recording layer to which a polymer compound or a composition which is insoluble or slightly soluble before heating and becomes more soluble in a solvent under heating is mixed, and Japanese Patent (Application) Laid-Open No. 69192/1981 discloses a heat-sensitive recording material having a heat-sensitive layer containing a novolak type phenol resin and a carbon black. However, these patents disclose only the examples of the case where images are recorded without using laser beams, and when images are recorded by lasers having emission regions from near infrared to infrared as the exposure light sources in the case of directly plate-making from digital data such as computers, good printed matters cannot necessarily be obtained due to background stain (i.e., scum) and the reduction of impression capability. For obtaining good printed matter, it is necessary that an exposed area (a non-image area) should be easily dissolved and an unexposed area (an image area) remain by alkali development processing after exposure and the remaining image area have good durability. That is, it is thought that since the recording property of the image is not good, the non-image area is dissolved with difficulty and the image area is easily dissolved when laser beams are used in the above well-known techniques.

To cope with these problems by conventional techniques, Japanese Patent (Application) Laid-Open No. 285275/1995 discloses to use, as the image-forming layer, an image-recording material containing a binder, a substance which absorbs light and generates heat, and a substance which is heat-decomposable and substantially reduces the solubility of the binder in the state not being decomposed, to thereby obtain a lithographic printing plate material having good printability capable of directly plate-making from digital signals such as computer data with conventional processing apparatus and printing machine as they are.

However, when the material is processed with a fatigued developing solution lowered in activity, the processability (development latitude) is not sufficient even with the technique disclosed in Japanese Patent Laid-Open No. 285275/1995.

SUMMARY OF THE INVENTION

An object of the present invention is to overcome the drawbacks of prior art techniques and provide an infrared-sensitive photosensitive composition which shows excellent processability (development latitude) with a fatigued developing solution lowered in activity when used as the image-forming layer and the like of a lithographic printing plate precursor.

As a result of eager investigation, the present inventors have found that the above object can be achieved by adding an alkali-soluble resin containing a repeating unit having an alkylene oxide group or a specific polyurethane resin to an infrared-sensitive photosensitive composition which can be used as the image-forming layer of a lithographic printing plate precursor.

That is, the object of the present invention can be achieved by the following first and second constitutions:

First Constitution:

(1) An infrared-sensitive photosensitive composition comprising:

(A) an alkali-soluble resin containing a repeating unit having an alkylene oxide group, and (B) a light-to-heat converting agent.

Second Constitution:

(1) An infrared-sensitive photosensitive composition comprising:

(A') a polyurethane resin having a diol represented by the following formula (II) or (III) as a constituent:

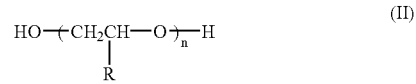

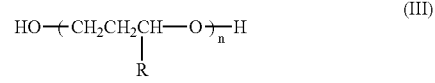

wherein R represents a hydrogen atom or an alkyl group having from 1 to 8 carbon atoms; and n represents an integer of 2 or higher, (B) a light-to-heat converting agent, and (C) a novolak resin.

The preferred embodiments of the second constitution are as follows.

(2) The infrared-sensitive photosensitive composition described in the above item (1), wherein polyurethane resin (A') further contains a substituent having an acidic hydrogen atom.

(3) The infrared-sensitive photosensitive composition described in the above item (1) or (2), wherein (B) a light-to-heat converting agent is a cyanine dye.

DETAILED DESCRIPTION OF THE INVENTION

The infrared-sensitive photosensitive composition in the first constitution is described in detail below.

In the first place, an alkali-soluble resin (A) containing a repeating unit having an alkylene oxide group (hereinafter also referred to as "component (A)" or "resin (A)") is described in detail below.

The repeating unit having an alkylene oxide group in resin (A) is preferably a repeating unit represented by the following formula (I):

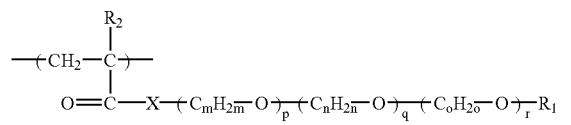
(I)

wherein X represents O, S or N—$R_3$; $R_1$, $R_2$ and $R_3$ each represents a hydrogen atom or an alkyl group; m, n and o each represents an integer of from 2 to 5; $C_mH_{2m}$, $C_nH_{2n}$, $C_oH_{2o}$ each may be straight chain or branched; and p, q and r each represents an integer of from 0 to 3,000, provided that p+q+r≧2.

The alkyl group represented by $R_1$, $R_2$ and $R_3$ is preferably an alkyl group having from 1 to 12 carbon atoms, e.g., methyl, ethyl, n-propyl or i-propyl.

In the above formula (I), p, q and r each represents an integer of from 0 to 3,000, provided that p+q+r≧2.

p, q and r each represents an integer of from 0 to 3,000, preferably an integer of from 0 to 500, and more preferably an integer of from 0 to 100.

The examples of monomers corresponding to the monomer represented by formula (I) are shown below, but the present invention is not limited thereto.

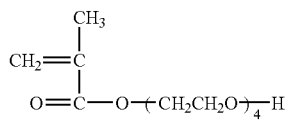
(1)

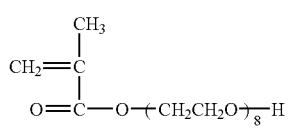
(2)

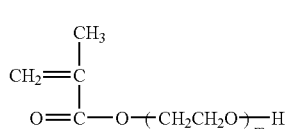
(3)

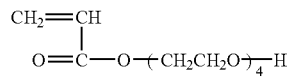
(4)

(average molecular weight of alkylene oxide: 1,000)

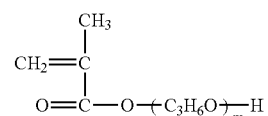
(5)

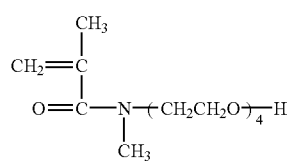
(6)

(average molecular weight of alkylene oxide: 1,000)

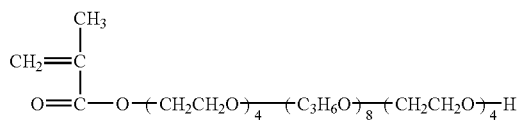
(7)

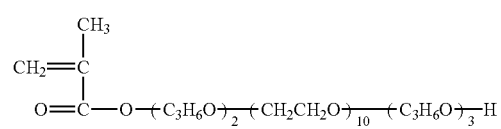
(8)

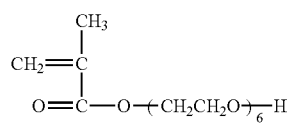
(9)

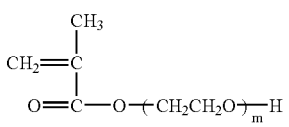
(10)

(average molecular weight of alkylene oxide: 500)

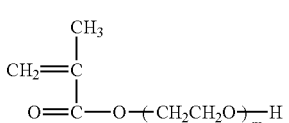
(11)

(average molecular weight of alkylene oxide: 2,000)

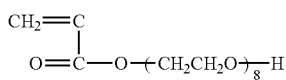

(12)

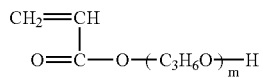

(13)

(average molecular weight of alkylene oxide: 1,500)

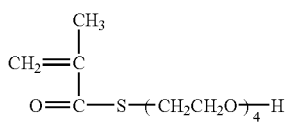

(14)

The repeating unit represented by formula (I) can be manufactured by the reaction of commercially available hydroxypoly(oxyalkylene) materials, e.g., materials known as the trade names of "Pluronic" and "Adeka Polyether" (manufactured by Asahi Denka Industries Co., Ltd.), "Carbowax" (manufactured by Glico Products Co., Ltd.), "Toriton" (manufactured by Rohm & Haas), and "P.E.G." (manufactured by Daiichi Kogyo Seiyaku Co., Ltd.) with acrylic acid, methacrylic acid, acryl chloride, methacryl chloride or acrylic anhydride by well-known methods.

Poly(oxyalkylene) diacrylates manufactured by well-known methods can also be used.

The examples of commercially available monomers include as terminal hydroxyl group polyalkylene glycol mono(meth)acrylate, e.g., Blenmer PE-90, Blenmer PE-20, Blenmer PE-350, Blenmer AE-90, Blenmer AE-200, Blenmer AE-400, Blenmer PP-1000, Blenmer PP-500, Blenmer PP-800, Blenmer AP-150, Blenmer AP-400, Blenmer AP-550, Blenmer AP-800, Blenmer 50PEP-300, Blenmer 70PEP-350B, Blenmer AEP series, Blenmer 55PET-400, Blenmer 30PET-800, Blenmer 55PET-800, Blenmer AET series, Blenmer 30PPT-800, Blenmer 50PPT-800, Blenmer 70PPT-800, Blenmer APT series, Blenmer 10PPB-500B and Blenmer 10APB-500B (manufactured by Nippon Oils & Fats Co., Ltd.); as terminal alkyl polyalkylene glycol mono (meth)acrylate, e.g., Blenmer PME-100, Blenmer PME-200, Blenmer PME-400, Blenmer PME-1000, Blenmer PME-4000, Blenmer AME-400, Blenmer 50POEP-800B, Blenmer 50AOEP-800B, Blenmer PLE-200, Blenmer ALE-200, Blenmer ALE-800, Blenmer PSE-400, Blenmer PSE-1300, Blenmer ASEP series, Blenmer PKEP series, Blenmer AKEP series, Blenmer ANE-300, Blenmer ANE-1300, Blenmer PNEP series, Blenmer PNPE series, Blenmer 43ANEP-500, and Blenmer 70ANEP-550 (manufactured by Nippon Oils & Fats Co., Ltd.); and light ester MC, light ester 130MA, light ester 041MA, light acrylate BO-A, light acrylate EC-A, light acrylate MTG-A, light acrylate 130A, light acrylate DPM-A, light acrylate P-200A, light acrylate NP-4EA and light acrylate NP-8EA (manufactured by Kyoei-Sha Chemical Co., Ltd.).

In the next place, the representative examples of the components copolymerizable with a repeating unit having an alkylene oxide group of resin (A) are described below.

The compounds having an acid group shown in the following (1) to (6) are preferably used as the components copolymerizable with a repeating unit having an alkylene oxide group of resin (A).

(1) As polymerizable monomers having a phenolic hydroxyl group, polymerizable monomers comprising a low molecular weight compound having one or more phenolic hydroxyl group(s) and one or more polymerizable unsaturated bond(s), e.g., acrylamide, methacrylamide, acrylic ester, methacrylic ester or hydroxystyrene each having a phenolic hydroxyl group are exemplified.

The specific examples of polymerizable monomers having a phenolic hydroxyl group include, e.g., N-(2-hydroxyphenyl)acrylamide, N-(3-hydroxyphenyl)acrylamide, N-(4-hydroxyphenyl)acrylamide, N-(2-hydroxyphenyl) methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl) ethyl methacrylate, 2-(3-hydroxyphenyl)ethyl methacrylate, and 2-(4-hydroxyphenyl)ethyl methacrylate. These monomers having a phenolic hydroxyl group may be used in combination of two or more.

(2) As polymerizable monomers having a sulfonamido group, polymerizable monomers comprising a low molecular weight compound having one or more sulfonamido group(s) having a nitrogen atom bonded with at least one hydrogen atom (—NH—SO$_2$—) and one or more polymerizable unsaturated bond(s) in one molecule are exemplified, e.g., low molecular weight compounds having an acryloyl group, an allyl group or a vinyloxy group, and a substituted or mono-substituted aminosulfonyl group or a substituted sulfonylimino group are preferred. As the examples of such compounds, e.g., the compounds represented by any of formulae (I) to (V) in Japanese Patent Laid-Open No. 123029/1996 are exemplified.

The specific examples of polymerizable monomers having a sulfonamido group (2) include, e.g., m-aminosulfonylphenyl methacrylate, N-(p-aminosulfonylphenyl)methacrylamide, and N-(p-aminosulfonylphenyl)acrylamide can be preferably used.

(3) As polymerizable monomers having an active imido group, the monomers having an imido group in the molecule as disclosed in Japanese Patent Laid-Open No. 84657/1999 are preferably used, and polymerizable monomers comprising a low molecular weight compound having one or more active imido group(s) and one or more polymerizable unsaturated bond(s) in one molecule are exemplified.

As the specific examples of polymerizable monomers having an active imido group (3), e.g., N-(p-toluenesulfonyl) methacrylamide and N-(p-toluenesulfonyl)acrylamide can be preferably used.

(4) As high polymers having a carboxylic acid group soluble in an aqueous alkali, e.g., polymers comprising, as a main constituent, a minimum constituent unit derived from a compound having one or more carboxylic acid group(s) and one or more polymerizable unsaturated group(s) in the molecule are exemplified.

(5) As high polymers having a sulfonic acid group soluble in an aqueous alkali, e.g., polymers comprising, as a main constituent, a minimum constituent unit derived from a compound having one or more sulfonic acid group(s) and one or more polymerizable unsaturated group(s) in the molecule are exemplified.

(6) As high polymers having a phosphoric acid group soluble in an aqueous alkali, e.g., polymers comprising, as a main constituent, a minimum constituent unit derived from a compound having one or more phosphoric acid group(s) and one or more polymerizable unsaturated group(s) in the molecule are exemplified.

The minimum constituent unit having an acid group selected from the above (1) to (6) which constitutes a high polymer soluble in an aqueous alkali for use in a positive lithographic printing plate precursor in the present invention need not be used alone, and two or more minimum constituent units having the same acid group may be used in combination, alternatively a minimum constituent unit obtained by copolymerizing two or more minimum constituent units each having a different acid group may be used.

Copolymerization maybe performed by any of conventionally well-known methods, e.g., graft copolymerization, block copolymerization and random copolymerization methods can be used.

Compounds having an acid group selected from (1) to (6) to be copolymerized are preferably contained in resin (A) in an amount of 10 mol % or more, more preferably 20 mol % or more. When the content is less than 10 mol %, the solubility in an aqueous alkali developing solution cannot be improved in some cases.

When a copolymer is formed by copolymerizing a compound in the present invention, the compound may be a compound other than the compounds having an acid group in (1) to (6). As the examples of other compounds not containing the acid groups in (1) to (6), the compounds shown in the following (m1) to (m12) are exemplified, but the present invention is not limited thereto.

(m1) Acrylic esters and methacrylic esters having an aliphatic hydroxyl group, e.g., 2-hydroxyethyl acrylate or 2-hydroxyethyl methacrylate;

(m2) Alkyl acrylates, e.g., methyl acrylate, ethyl acrylate, propyl acrylate, butyl acrylate, amyl acrylate, hexyl acrylate, octyl acrylate, benzyl acrylate, 2-chloroethyl acrylate and glycidyl acrylate;

(m3) Alkyl methacrylates, e.g., methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate;

(m4) Acrylamides or methacrylamides, e.g., acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide;

(m5) Vinyl ethers, e.g., ethyl vinyl ether, 2-chloroethyl vinyl ether, hydroxyethyl vinyl ether, propyl vinyl ether, butyl vinyl ether, octyl vinyl ether, and phenyl vinyl ether;

(m6) Vinyl esters, e.g., vinyl acetate, vinyl chloroacetate, vinyl butyrate, and vinyl benzoate;

(m7) Styrenes, e.g., styrene, α-methylstyrene, methylstyrene and chloromethylstyrene;

(m8) Vinyl ketones, e.g., methyl vinyl ketone, ethyl vinyl ketone, propyl vinyl ketone, and phenyl vinyl ketone;

(m9) Olefins, e.g., ethylene, propylene, isobutylene, butadiene and isoprene;

(m10) N-vinylpyrrolidone, acrylonitrile and methacrylonitrile;

(m11) Unsaturated imides, e.g., maleimide, N-acryloylacrylamide, N-acetylmethacrylamide, N-propionylmethacrylamide and N-(p-chlorobenzoyl)methacrylamide;

(m12) Unsaturated carboxylic acids, e.g., acrylic acid, methacrylic acid, maleic anhydride and itaconic acid.

The content of the repeating unit represented by formula (I) for use in resin (A) is 2 mol % or more based on the total amount of each monomer of resin (A), preferably from 2 to 70 mol %, and more preferably from 5 to 60 mol %.

The weight average molecular weight of resin (A) for use in the present invention is preferably from 3,000 to 300,000, and more preferably from 6,000 to 100,000.

The addition amount of resin (A) for use in the present invention is from 0.005 to 80 wt % based on the weight of the photosensitive composition for an image-forming layer (coating components exclusive of a solvent), preferably from 0.01 to 50 wt %, and more preferably from 1 to 20 wt %.

When the addition amount of resin (A) is less than 0.005 wt %, the effect of addition is insufficient, and when the amount is more than 8 wt %, drying of the coated film becomes insufficient and performances as the photosensitive material (e.g., sensitivity) are adversely affected.

Resin (A) for use in the present invention can be manufactured by well-known methods. For example, resin (A) can be manufactured by polymerization by adding a widely used radical polymerization initiator to a monomer such as (meth)acrylate having a fluoro-aliphatic group or a polyoxyalkylene group in an organic solvent, or resin (A) can be manufactured by the same method by adding other addition polymerizable unsaturated compound. Dripping polymerization method of dripping a monomer and an initiator to a reaction vessel according to the degree of polymerization of each monomer is also effective to obtain a polymer having homogeneous composition.

Further, cissing failure can be prevented by subjecting polymers abound in fluorine component to column filtration, re-precipitation purification or solvent extraction to thereby eliminate extra fluorine.

A light-to-heat converting agent (B) (hereinafter also referred to as "component (B)") is added to the infrared-sensitive photosensitive composition according to the present invention.

Light-to-heat converting agents (B) for use in the present invention are not particularly restricted so long as they are substances which absorb infrared rays and generate heat. In addition to infrared-absorbing dyes, various pigments known as infrared-absorbing pigments and infrared-absorbing dyes other than those exemplified can be used.

As such pigments, commercially available pigments and pigments described in Color Index (C.I.), *Saishin Ganryo Binran* (*Handbook of the Latest Pigments*), compiled by Nippon Ganryo Gijutsu Kyokai (1977), *Saishin Ganryo Oyo Gijutsu* (*Applied Techniques of the Latest Pigments*), CMC Publishing Co. (1986), and *Insatsu Ink Gijutsu* (*Printing Ink Techniques*), CMC Publishing Co. (1984) can be used.

As the kinds of pigments which can be used in the present invention, black pigments, yellow pigments, orange pigments, brown pigments, red pigments, purple pigments, blue pigments, green pigments, fluorescent pigments, metal powder pigments, and polymer-bonded pigments can be exemplified. Specifically, insoluble azo pigments, azo lake pigments, condensation azo pigments, chelate azo pigments, phthalocyanine-series pigments, anthraquinone-series pigments, perylene-series pigments, perinone-series pigments, thioindigo-series pigments, quinacridone-series pigments, dioxazine-series pigments, isoindolinone-series pigments, quinophthalone-series pigments, dyeing lake pigments, azine pigments, nitroso pigments, nitro pigments, natural pigments, fluorescent pigments, inorganic pigments and carbon black can be used.

These pigments can be used without surface treatment or may be surface-treated. As the methods of surface treatments, a method of surface-coating with a resin and a wax, a method of adhering a surfactant, and a method of bonding a reactive substance (e.g., a silane coupling agent, an epoxy compound and polyisocyanate) on the surface of a pigment can be exemplified. These surface treatment methods are described in *Kinzoku Sekken no Seishitsu to Oyo* (*Natures and Applications of Metal Soaps*), Saiwai Shobo Co., *Insatsu Ink Gijutsu* (*Printing Ink Techniques*), CMC Publishing Co. (1984), and *Saishin Ganryo Oyo Gijutsu* (*Applied Techniques of the Latest Pigments*), CMC Publishing Co. (1986).

The pigments have a particle size of preferably from 0.01 to 10 μm, more preferably from 0.05 to 1 μm, and particularly preferably from 0.1 to 1 μm. When the particle size of these pigments is less than 0.01 μm, it is difficult to obtain the stability of dispersion in the coating solution of a recording layer, and when the particle size exceeds 10 μm, a uniform recording layer cannot be obtained.

Well-know dispersion methods used in the manufacture of inks and toners can be used as the dispersing methods of pigments. The examples of dispersing apparatus include an ultrasonic disperser, a sand mill, an attritor, a pearl mill, a super-mill, a ball mill, an impeller, a disperser, a KD mill, a colloid mill, a dynatron, a three-roll mill, and a pressure kneader, and details of the dispersing apparatus are described in detail in *Saishin Ganryo Oyo Gijutsu* (*Applied Techniques of the Latest Pigments*), CMC Publishing Co. (1986).

As dyes for this purpose, commercially available dyes and well-known dyes described, e.g., in *Senryo Binran* (*Dye Handbook*), compiled by Yuki Gosei Kagaku Kyokai (1970) can be used. The specific examples of these dyes include azo dyes, metal complex azo dyes, pyrazolone azo dyes, anthraquinone dyes, phthalocyanine dyes, carbonium dyes, quinoneimine dyes, methine dyes and cyanine dyes.

Of the above-described pigments and dyes, those which absorb infrared rays or near infrared rays are particularly preferably used in the point that they are suitable for use in lasers which emit infrared rays or near infrared rays.

As such pigments which absorb infrared rays or near infrared rays, carbon blacks are preferably used. Further, as dyes which absorb infrared rays or near infrared rays, e.g., the cyanine dyes disclosed in Japanese Patent Laid-Open Nos. 125246/1983, 84356/1984, 202829/1984, and 78787/1985, the methine dyes disclosed in Japanese Patent Laid-Open Nos. 173696/1983, 181690/1983, and 194595/1983, the naphthoquinone dyes disclosed in Japanese Patent Laid-Open Nos. 112793/1983, 224793/1983, 48187/1984, 73996/1984, 52940/1985 and 63744/1985, the squarylium dyes disclosed in Japanese Patent Laid-Open No. 112792/1983, and the cyanine dyes disclosed in British Patent 434,875 can be exemplified.

Further, the near infrared-absorbing sensitizing dyes disclosed in U.S. Pat. No. 5,156,938 are also preferably used. In addition, the substituted arylbenzo(thio)pyrylium salts disclosed in U.S. Pat. No. 3,881,924, the trimethine thiapyrylium salts disclosed in Japanese Patent Laid-Open No. 142645/1982 (corresponding to U.S. Pat. No. 4,327,169), the pyrylium series compounds disclosed in Japanese Patent Laid-Open Nos. 181051/1983, 220143/1983, 41363/1984, 84248/1984, 84249/1984, 146063/1984, and 146061/1984, the cyanine dyes disclosed in Japanese Patent Laid-Open No. 216146/1984, the pentamethine thiopyrylium salts disclosed in U.S. Pat. No. 4,283,475, the pyrylium compounds disclosed in Japanese Patent Publication Nos. 13514/1993 and 19702/1993, and Epolight III-178, Epolight III-130, and Epolight III-125 (manufactured by Epoline) are particularly preferably used as commercially available products.

As other examples of particularly preferred dyes, the near infrared-absorbing dyes disclosed in U.S. Pat. No. 4,756,993, formulae (I) and (II) can be exemplified.

These pigments or dyes are used in an amount of from 0.01 to 50 wt %, preferably from 0.1 to 10 wt %, based on the total solid content of the material, and in the case of dyes, particularly preferably the amount of from 0.5 to 10 wt %, and in the case of pigments, particularly preferably the amount of from 3.1 to 10 wt %, can be added to the composition.

When the addition amount of pigments or dyes is less than 0.01 wt %, the sensitivity lowers, and when it exceeds 50 wt %, the uniformity of the image-forming layer is lost and the durability of the image-forming layer is deteriorated. These dyes or pigments maybe added in the same layer with other components, alternatively, other layer can be provided and they may be added therein.

The infrared-sensitive photosensitive composition in the second constitution is described in detail below.

In the first place, a polyurethane resin (A') (hereinafter also referred to as "component (A')" or "resin (A')") is described in detail below.

Resin (A') has a diol represented by the following formula (II) or (III) as a constituent.

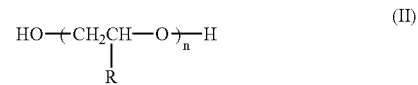 (II)

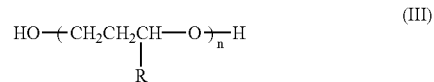 (III)

wherein R represents a hydrogen atom or an alkyl group having from 1 to 8 carbon atoms, and n represents an integer of 2 or higher.

As the alkyl group having from 1 to 8 carbon atoms represented by R, e.g.,methyl, ethyl, i-propyl, n-propyl, n-butyl and i-butyl are exemplified.

The specific examples of the diols represented by formula (II) or (III) are shown below, but the present invention is not limited thereto.

Specific Examples of (II)

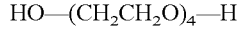
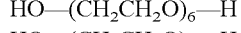
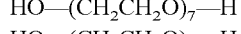
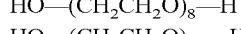
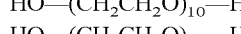
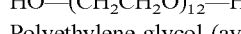

Polyethylene glycol (average molecular weight: 1,000)
Polyethylene glycol (average molecular weight: 2,000)
Polyethylene glycol (average molecular weight: 4,000)

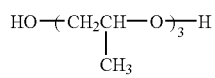

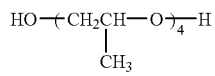

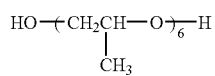

Polypropylene glycol (average molecular weight: 1,000)
Polypropylene glycol (average molecular weight: 2,000)
Polypropylene glycol (average molecular weight: 4,000)

Specific Examples of (III)

Polyurethane resin (A') can be manufactured by various methods. For example, a polyurethane resin having the reaction product of a diisocyanate compound represented by the following formula (IV) and a diol compound represented by the above formula (II) or (III) as a fundamental skeleton:

$$OCN-R^1-NCO \quad (IV)$$

wherein $R^1$ represents a divalent aliphatic or aromatic hydrocarbon which may have a substituent (e.g., preferably an alkyl, alkenyl, aralkyl, aryl, alkoxyl or halogeno group). $R^1$ may contain other functional group which does not react with isocyanate groups, e.g., an ester group, a urethane group, an amido group, a ureido group, or a carbon-carbon unsaturated bond, if necessary.

As the diisocyanate compounds represented by formula (IV), specifically the following compounds are included, i.e., aromatic diisocyanate compounds, e.g., 2,4-tolylene diisocyanate, a dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate, and 3,3'-dimethylbiphenyl-4,4'-diisocyanate; aliphatic diisocyanate compounds, e.g., hexamethylene diisocyanate, trimethylhexamethylene diisocyanate, lysine diisocyanate, and dimer acid diisocyanate; aliphatic diisocyanate compounds, e.g., isophorone diisocyanate, 4,4'-methylene-bis(cyclohexyl isocyanate), methylcyclohexane-2,4(or 2,6)-diisocyanate, and 1,3-(isocyanate methyl)cyclohexane; and diisocyanate compounds which are the reaction products of diol and diisocyanate, e.g., the adducts of 1 mol of 1,3-butylene glycol and 2 mols of tolylene diisocyanate.

Polyurethane resin (A') is preferably a reaction product obtained by combining diols having a substituent containing an acidic hydrogen atom represented by any of the following formulae (V) to (XI).

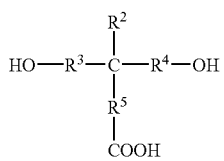

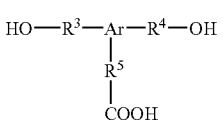

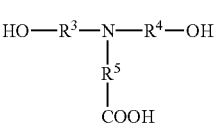

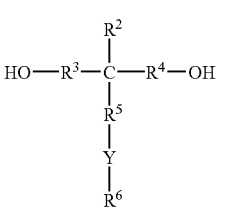

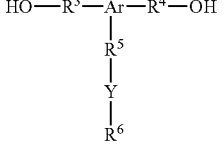

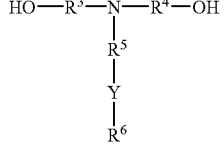

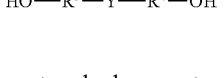

wherein $R^2$ represents a hydrogen atom, an alkyl, alkenyl, aralkyl, aryl, alkoxyl, or aryloxy group which may have a substituent (e.g., preferably an alkyl, aryl, alkoxyl, ester, urethane, amido, ureido or halogeno group). $R^2$ preferably represents a hydrogen atom, an alkyl group having from 1 to 8 carbon atoms, an alkenyl group having from 2 to 8 carbon atoms, or an aryl group having from 6 to 15 carbon atoms; $R^3$, $R^4$ and $R^5$, which may be the same or different, each represents a divalent aliphatic or aromatic hydrocarbon group which may have a single bond or a substituent (e.g., preferably an alkyl, alkenyl, aralkyl, aryl, alkoxyl or halogeno group). $R^3$, $R^4$ and $R^5$ each preferably represents an alkylene group having from 1 to 20 carbon atoms or an arylene group having from 6 to 15 carbon atoms, and more preferably an alkylene group having from 1 to 8 carbon atoms.

Further, if necessary, $R^3$, $R^4$ and $R^5$ may contain other functional groups which do not react with isocyanate groups, e.g., an ester group, a urethane group, an amido group, a ureido group, or a carbon-carbon unsaturated bond. Two or three of $R^3$, $R^4$ and $R^5$ may form a ring together.

Ar represents a trivalent aromatic hydrocarbon group which may have a substituent, preferably an aromatic group having from 6 to 15 carbon atoms.

In the above formulae, $R^6$ represents a monovalent aliphatic or aromatic hydrocarbon group which may have a substituent (e.g., preferably an alkyl, alkoxyl or halogeno group). $R^6$ preferably represents an alkyl group having from 1 to 20 carbon atoms, an alkenyl group having from 2 to 20 carbon atoms, an aryl group having from 6 to 15 carbon atoms, or an aralkyl group having from 7 to 15 carbon atoms, more preferably an alkyl group having from 1 to 8 carbon atoms, an alkenyl group having from 2 to 8 carbon atoms, or an aryl group having from 6 to 10 carbon atoms.

Y represents an N-sulfonylamido group (—CO—NH—SO$_2$—), an N-sulfonylureido group (—NH—CO—NH—SO$_2$—), an N-amino-sulfonylamido group (—CO—NH—SO$_2$—NH—), or a sulfonylurethane group (—O—CO—NH—SO$_2$—).

The specific examples of diols having a carboxyl group represented by formula (V), (VI) or (VII) include 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid, tartaric acid, and N,N-bis(2-hydroxyethyl)-3-carboxy-propionamide.

A diol compound represented by formula (VIII), (IX), (X) or (XI) is synthesized, e.g., by protecting the hydroxyl group of a diol having a carboxyl group represented by formula (V), (VI) or (VII), and then subjecting to reaction with a compound represented by formula (XII), (XIII), (XIV) or (XV) in the presence of a base. Further, the above-synthesized product is subjected to reaction with chlorosulfonyl isocyanate, and then with an amine compound represented by formula (XVI).

$R^6$—SO$_2$—NCO  (XII)

X—R$^3$—CO—NH—SO$_2$—R$^6$  (XIII)

X—R$^3$—NH—CO—NH—SO$_2$—R$^6$  (XIV)

X—R$^3$—CO—NH—SO$_2$—NH—R$^6$  (XV)

$R^6$—NH$_2$  (XVI)

wherein X represents a chlorine atom or a bromine atom. In the case where Y represents a sulfonylurethane group, one of trihydroxyl compounds can be synthesized by reacting a hydroxyl group with a compound represented by formula (XVI).

The specific examples of diol compounds represented by formulae (VIII), (IX), (X) and (XI) are shown below.

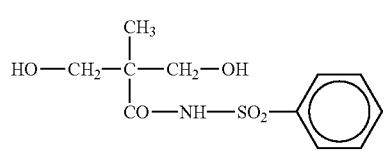
(No. 1)

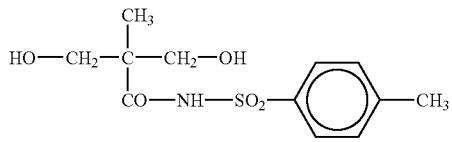
(No. 2)

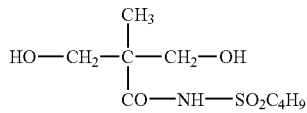
(No. 3)

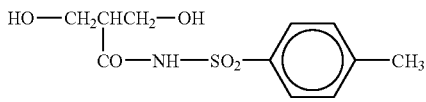
(No. 4)

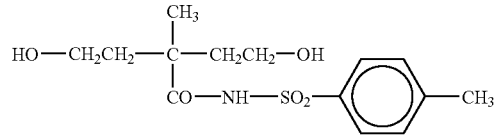
(No. 5)

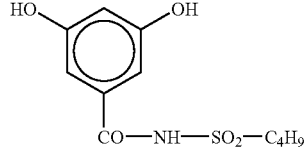
(No. 6)

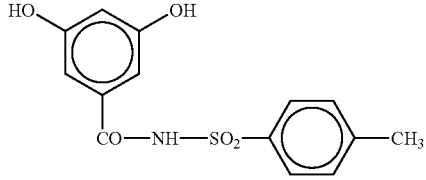
(No. 7)

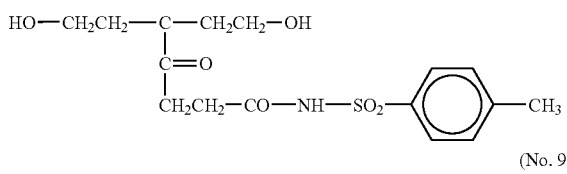
(No. 8)

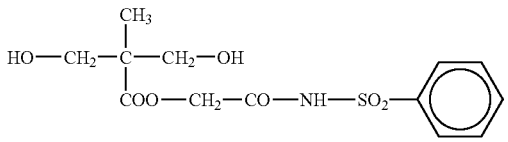
(No. 9)

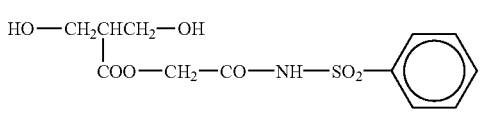
(No. 10)

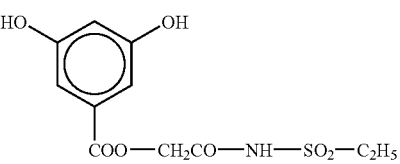
(No. 11)

-continued

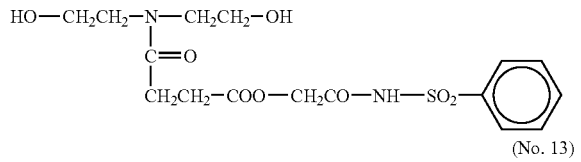
(No. 12)

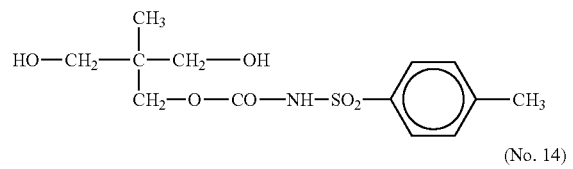
(No. 13)

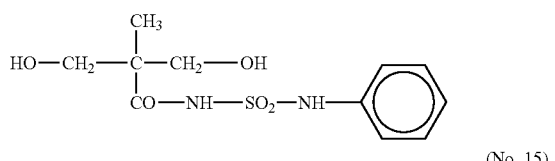
(No. 14)

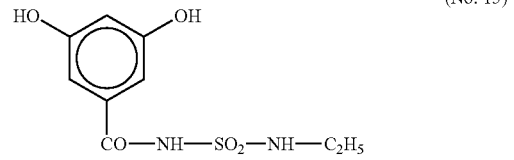
(No. 15)

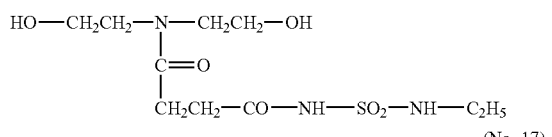
(No. 16)

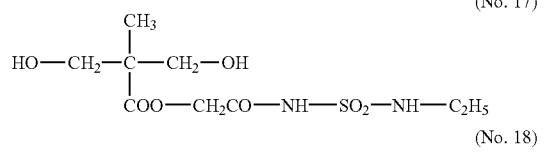
(No. 17)

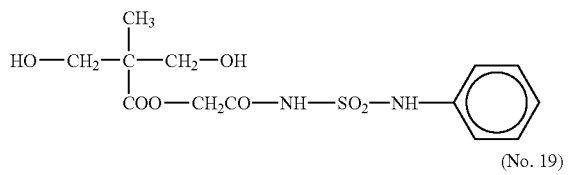
(No. 18)

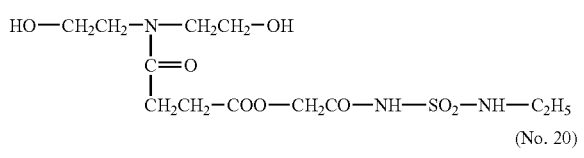
(No. 19)

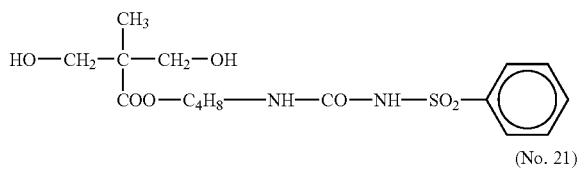
(No. 20)

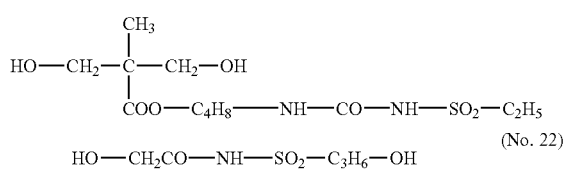
(No. 21)

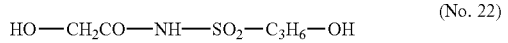
(No. 22)

HO—CH$_2$CO—NH—SO$_2$—C$_3$H$_6$—OH

-continued

HO—CH$_2$CO—NH—SO$_2$—NH—C$_2$H$_4$—OH (No. 23)

HO—C$_3$H$_6$CO—NH—SO$_2$—NH—C$_2$H$_4$—OH (No. 24)

The weight average molecular weight of the above polyurethane resins preferably used in the present invention is from 5,000 to 800,000 (in terms of polystyrene), preferably from 10,000 to 500,000, and more preferably from 20,000 to 200,000. The degree of dispersion (Mw/Mn) at this time is 20 or less, preferably 16 or less, and more preferably 14 or less. When the molecular weight is low, the effect of the present invention is small, and when the molecular weight is high, developability conspicuously lowers.

The content of the polyurethane resin in the photosensitive composition according to the present invention is from 1 to 30 wt % in terms of a solid content, preferably from 2 to 20 wt %. The polyurethane resin in the present invention can be synthesized by adding a catalyst, whose activities to the degrees of reactivities are well-known, to the above diisocyanate compound and diol compound in an aprotic solvent and heating.

The molar ratio of the diisocyanate compound to diol compound used is preferably from 0.8/1 to 1.2/1, and when isocyanate groups remain at the terminals of the polymer, the polymer free of isocyanate groups can be synthesized by treating with alcohols or amines.

The synthesis examples of polyurethane resin (A') for use in the present invention are shown below.

SYNTHESIS EXAMPLE 1

2,2-Bis(hydroxymethyl)propionic acid (14.6 g) (0.109 mol), 13.3 g (0.0686 mol) of tetraethylene glycol, and 2.05 g (0.0228 mol) of 1,4-butanediol were put in around bottom three-neck flask equipped with a cooling pipe and a stirrer, and dissolved in 118 g of N,N-dimethylacetamide. 4,4'-Diphenylmethane diisocyanate (30.8 g) (0.123 mol), 13.8 g (0.0819 mol) of hexamethylene diisocyanate, and 0.1 g of di-n-butyl tin dilaurate as a catalyst were added to the above solution, and the reaction mixture was heated at 90° C. for 7 hours with stirring. N,N-Dimethylacetamide (100 ml), 50 ml of methanol and 50 ml of acetic acid were added to the reaction solution and stirred, and the reaction mixture was poured into 4 liters of water with stirring, thereby a white polymer was precipitated. The polymer was filtered out, washed with water, and then dried under reduced pressure, thereby 60 g of a polymer (Polyurethane Resin (a)) was obtained.

The molecular weight of Polyurethane Resin (a) measured by gel permeation chromatography (GPC) was 70,000 on weight average (in terms of polystyrene). The carboxyl group content measured by titration was 1.43 meq/g.

SYNTHESIS EXAMPLES 2 TO 6

Polyurethane Resins (b) to (f) were synthesized in the same manner as in Synthesis Example 1 by using the diisocyanate compounds shown in Table A and the diol compounds shown in Table B. The oxygen content measured by titration and the molecular weight measured by GPC of each polyurethane resin are shown together in Table B.

Comparative Synthesis Example 1

Polyurethane Resins (g) and (h) not containing a diol component represented by formula (I) were synthesized for the sake of comparison. The diisocyanates used are shown in Table C, and the diols used, the oxygen content and the molecular weight of each polyurethane resin are shown in Table D.

TABLE A

| Synthesis Example | Polyurethane Resin | Diisocyanate Compound Used (mol %) | | |
|---|---|---|---|---|
| 2 | b | OCN—⟨C₆H₄⟩—CH₂—⟨C₆H₄⟩—NCO (70) | | OCN(CH₂)₆NCO (30) |
| 3 | c | 5-isocyanato-1-(isocyanatomethyl)-1,3,3-trimethylcyclohexane (isophorone diisocyanate) (50) | | m-xylylene diisocyanate (50) |
| 4 | d | OCN—⟨C₆H₄⟩—CH₂—⟨C₆H₄⟩—NCO (80) | | OCN(CH₂)₆NCO (20) |
| 5 | e | 1,5-naphthalene diisocyanate (30) | | OCN(CH₂)₆NCO (70) |
| 6 | f | 2,4-tolylene diisocyanate (100) | | |

TABLE B

| Synthesis Example | Polyurethane Resin | Diol Compound Used (mol %) | | Oxygen Content (mg/m²) | Weight Average Molecular Weight (in terms of polystyrene) |
|---|---|---|---|---|---|
| 2 | b | 3,5-dihydroxybenzoic acid (60) | HO(CH₂CH₂O)₄H (40) | 1.68 | 80,000 |
| 3 | c | 4,4'-bis(4-hydroxyphenyl)valeric acid-type [HO—⟨C₆H₄⟩—CH(COOH)—⟨C₆H₄⟩—COOH] (50) | HO(CH₂CH₂O)₆H (50) | 1.20 | 60,000 |
| 4 | d | HOH₂C—C(CH₃)(COOH)—CH₂OH (75) | HO(CH₂CH₂O)₁₂H with CH₃ (25) | 1.68 | 50,000 |

TABLE B-continued

| Synthesis Example | Polyurethane Resin | Diol Compound Used (mol %) | | Oxygen Content (mg/m$^2$) | Weight Average Molecular Weight (in terms of polystyrene) |
|---|---|---|---|---|---|
| 5 | e | HOCH$_2$C(CH$_3$)(COOC$_2$H$_4$NHCONHSO$_2$–C$_6$H$_5$)CH$_2$OH (80) | HO(CH$_2$CH$_2$O)$_8$H (20) | 1.60 | 32,000 |
| 6 | f | HOCH$_2$C(CH$_3$)(CH$_2$OCONHSO$_2$–C$_6$H$_4$–CH$_3$)CH$_2$OH (80) | HO(CH$_2$CH$_2$O)$_n$H av. mol. wt.: 1,000 (20) | 1.66 | 30,000 |

TABLE C

| Comparative Synthesis Example | Polyurethane Resin | Diisocyanate Compound Used (mol %) | |
|---|---|---|---|
| 1 | g | OCN–C$_6$H$_4$–CH$_2$–C$_6$H$_4$–NCO (60) | OCN(CH$_2$)$_6$NCO (40) |
| 2 | h | OCN–C$_6$H$_4$–CH$_2$–C$_6$H$_4$–NCO (80) | OCN(CH$_2$)$_6$NCO (20) |

TABLE D

| Comparative Synthesis Example | Polyurethane Resin | Diol Compound Used (mol %) | | Oxygen Content (mg/m$^2$) | Weight Average Molecular Weight (in terms of polystyrene) |
|---|---|---|---|---|---|
| 1 | g | HOCH$_2$C(CH$_3$)(COOH)CH$_2$OH (54) | HO(CH$_2$)$_4$OH (46) | 1.63 | 70,000 |
| 2 | h | HOCH$_2$C(CH$_3$)(COOH)CH$_2$OH (65) | HOCH$_2$CH$_2$OH (35) | 1.69 | 120,000 |

In the next place, novolak resin (C) according to the present invention is described in detail below.

As the novolak resin, novolak resins, e.g., phenol-formaldehyde resins, m-cresol-formaldehyde resins, p-cresol-formaldehyde resins, mixed m-/p-cresol-formaldehyde resins, mixed phenol-cresol(any of m-, p-, or m-/p- mixtures may be used)-formaldehyde resins, and pyrogallol-acetone resins are preferably used in the present invention.

As disclosed in U.S. Pat. No. 4,123,279, condensation polymerization products of phenol and formaldehyde having an alkyl group having from 3 to 8 carbon atoms as a substituent, e.g., t-butylphenol-formaldehyde resins and octylphenol-formaldehyde resins are exemplified. The weight average molecular weight of such condensation polymerization products is preferably 500 or more, more preferably from 1,000 to 700,000, and the number average molecular weight is preferably 500 or more, and more preferably from 750 to 650,000. The degree of dispersion (weight average molecular weight/number average molecular weight) of the condensation polymerization products is preferably from 1.1 to 10.

When the infrared-sensitive photosensitive composition according to the present invention is used in a photosensitive layer of a lithographic printing plate precursor, it is necessary that a novolak resin for use in the present invention should be used in proportion of 50 wt % or more of the total solid contents of the photosensitive layer. When the content of the novolak resin is less than 50 wt %, the effect of improving press life by burning treatment is low, and the photosensitive composition is unusable. The content of the novolak resin is more preferably 70 wt % or more, and particularly preferably 80 wt % or more.

To the infrared-sensitive photosensitive composition in the second constitution, (B) a light-to-heat converting agent (hereinafter also referred to as "component (B)") is added.

Light-to-heat converting agents (B) for use in the present invention are not particularly restricted so long as they are substances which absorb infrared rays and generate heat. In addition to infrared-absorbing dyes, the above-described various pigments known as infrared-absorbing pigments and infrared-absorbing dyes other than those exemplified can be used.

It is preferred that the infrared-sensitive photo-sensitive composition in the first or second constitution further contain (D) a water-insoluble but aqueous alkali-soluble resin (hereinafter referred to as "an alkali-soluble resin").

The examples of alkali-soluble resins (D) include, e.g., phenol-formaldehyde resins, cresol-formaldehyde resins, phenol-cresol-formaldehyde co-condensation resins, phenol-modified xylene resins, polyhydroxystyrene, hydroxystyrene polyhalide, N-(4-hydroxyphenyl)methacrylamide copolymers, hydroquinone monomethacrylate copolymers, sulfonylimide polymers disclosed in Japanese Patent Laid-Open No. 28244/1994, and carboxyl group-containing polymers disclosed in Japanese Patent Laid-Open No. 36184/1994.

In addition, various alkali-soluble high molecular weight compounds such as acrylate resins having a phenolic hydroxyl group as disclosed in Japanese Patent Laid-Open No. 34711/1976, acrylate resins having a sulfonamido group as disclosed in Japanese Patent Laid-Open No. 866/1990, and urethane resins can also be used.

These alkali-soluble high molecular weight compounds preferably have a weight average molecular weight of from 500 to 20,000 and a number average molecular weight of from 200 to 60,000. These alkali-soluble high molecular weight compounds can be used alone or in combination of two or more, and they are used in an amount of 80 wt % or less based on the entire compositions.

Further, for the purpose of improving the sensitizing property of an image, it is preferred to use, as disclosed in U.S. Pat. No. 4,123,279, condensation products of phenol and formaldehyde having an alkyl group having from 3 to 8 carbon atoms as a substituent, e.g., t-butylphenol-formaldehyde resins and octylphenol-formaldehyde resins. Such alkali-soluble resins are generally used in an amount of 90 wt % or less based on the total weight of the composition.

In the present invention, high molecular weight compounds having any functional group of (a-1) a phenolic hydroxyl group, (a-2) a sulfonamido group, and (a-3) an active imido group are exemplified as particularly preferred other alkali-soluble resins, e.g., the following compounds are exemplified.

As high molecular weight compounds having a phenolic hydroxyl group (a-1), high molecular weight compounds having a phenolic hydroxyl group on the side chain can be used. As high molecular weight compounds having a phenolic hydroxyl group on the side chain, high molecular weight compounds obtained by homopolymerization of a polymerizable monomer comprising a low molecular weight compound having one or more phenolic hydroxyl group(s) and one or more polymerizable unsaturated bond(s), or by copolymerization of the monomer and other polymerizable monomer can be exemplified.

As polymerizable monomers having a phenolic hydroxyl group, acrylamide, methacrylamide, acrylic ester, methacrylic ester and hydroxystyrene each having a phenolic hydroxyl group can be exemplified. Specifically, N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate can be preferably used.

These resins having a phenolic hydroxyl group may be used alone or two or more resins may be used in combination.

As high molecular weight compounds having a sulfonamido group (a-2), high molecular weight compounds obtained by homopolymerization of a polymerizable monomer having a sulfonamido group, or by copolymerization of the monomer and other polymerizable monomers can be exemplified. As polymerizable monomers having a sulfonamido group, polymerizable monomers comprising a low molecular weight compound having one or more sulfonamido group(s) having a nitrogen atom bonded to at least one hydrogen atom (—NH—SO$_2$—) and one or more polymerizable unsaturated bond(s) in one molecule are exemplified. Of these monomers, low molecular weight compounds having an acryloyl group, an aryl group or a vinyloxy group, and a substituted or mono-substituted aminosulfonyl group or a substituted sulfonylimino group are preferred.

As such compounds, e.g., the compounds represented by the following formulae (a) to (e) respectively are exemplified but the present invention is not limited thereto.

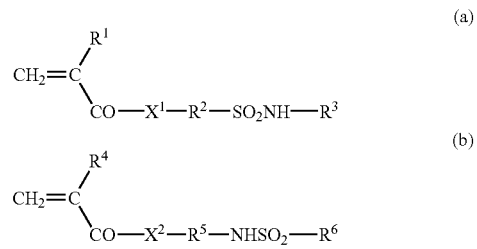

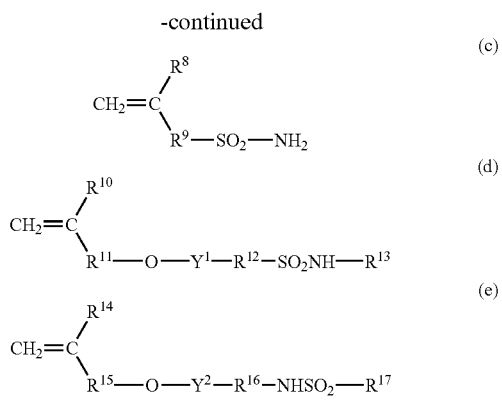

wherein $X^1$ and $X^2$ each represents an oxygen atom or $NR^7$; $R^1$ and $R^4$ each represents a hydrogen atom or $CH_3$; $R^2$, $R^5$, $R^9$, $R^{12}$ and $R^{16}$ each represents an alkylene group having from 1 to 12 carbon atoms which may have a substituent, a cycloalkylene group, an arylene group, or an aralkylene group; $R^3$, $R^7$ and $R^{13}$ each represents a hydrogen atom, an alkyl group having from 1 to 12 carbon atoms which may have a substituent, a cycloalkyl group, an aryl group, or an aralkyl group; $R^6$ and $R^{17}$ each represents an alkyl group having from 1 to 12 carbon atoms which may have a substituent, a cycloalkyl group, an aryl group, or an aralkyl group; $R^8$, $R^{10}$ and $R^{14}$ each represents a hydrogen atom or $CH_3$; $R^{11}$ and $R^{15}$ each represents an alkylene group having from 1 to 12 carbon atoms which may have a single bond and a substituent, a cycloalkylene group, an arylene group, or an aralkylene group; and $Y^1$ and $Y^2$ each represents a single bond or CO.

Specifically, m-aminosulfonylphenyl methacrylate, N-(p-aminosulfonylphenyl)methacrylamide, and N-(p-aminosulfonylphenyl)acrylamide can be preferably used as such monomers.

High molecular weight compounds having an active imido group (a-3) are high molecular weight compounds having an active imido group represented by the following formula in the molecule. The high molecular weight compounds can be obtained by homopolymerization of a polymerizable monomer comprising a low molecular weight compound having one or more active imido group(s) represented by the following formula and one or more polymerizable unsaturated bond(s) in one molecule, or by copolymerization of the monomer and other polymerizable monomer can be exemplified.

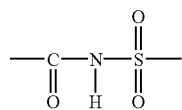

As the specific examples of such compounds, N-(p-toluenesulfonyl)methacrylamide and N-(p-toluenesulfonyl)acrylamide can be preferably used.

As other alkali-soluble resins, high molecular weight compounds obtained by polymerization of two or more of the above polymerizable monomer having a phenolic hydroxyl group, polymerizable monomer having a sulfonamido group and polymerizable monomer having an active imido group, and by copolymerization of two or more of these polymerizable monomers and other polymerizable monomers can be used.

When a polymerizable monomer having a phenolic hydroxyl group is polymerized with a polymerizable monomer having a sulfonamido group and/or a polymerizable monomer having an active imido group, the mixing ratio of these components is preferably from 50/50 to 5/95, and particularly preferably from 40/60 to 10/90.

When other alkali-soluble resins are the copolymers of a polymerizable monomer having a phenolic hydroxyl group, a polymerizable monomer having a sulfonamido group or a polymerizable monomer having an active imido group with other polymerizable monomers, it is preferred that the monomer giving alkali solubility is contained in an amount of 10 mol % or more, and more preferably 20 mol % or more. When the amount of the copolymer component is less than 10 mol %, alkali solubility is insufficient and the improving effect of development latitude becomes unsatisfactory.

As the monomer components which are copolymerizable with a polymerizable monomer having a phenolic hydroxyl group, a polymerizable monomer having a sulfonamido group or a polymerizable monomer having an active imido group, e.g., the monomers described in the following (1) to (12) can be used but the present invention is not limited to these monomers.

(1) Acrylic esters and methacrylic esters having an aliphatic hydroxyl group, e.g., 2-hydroxyethyl acrylate and 2-hydroxyethyl methacrylate;

(2) Alkyl acrylates, e.g., methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and N-dimethylaminoethyl acrylate;

(3) Alkyl methacrylates, e.g., methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate and N-dimethylaminoethyl methacrylate;

(4) Acrylamides or methacrylamides, e.g., acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide and N-ethyl-N-phenylacrylamide;

(5) Vinyl ethers, e.g., ethyl vinyl ether, 2-chloroethyl vinyl ether, hydroxyethyl vinyl ether, propyl vinyl ether, butyl vinyl ether, octyl vinyl ether and phenyl vinyl ether;

(6) Vinyl esters, e.g., vinyl acetate, vinyl chloroacetate, vinyl butyrate and vinyl benzoate;

(7) Styrenes, e.g., styrene, α-methylstyrene, methylstyrene and chloromethylstyrene;

(8) Vinyl ketones, e.g., methyl vinyl ketone, ethyl vinyl ketone, propyl vinyl ketone and phenyl vinyl ketone;

(9) Olefins, e.g., ethylene, propylene, isobutylene, butadiene and isoprene.

(10) N-vinylpyrrolidone, N-vinylcarbazole, 4-vinylpyridine, acrylonitrile and methacrylonitrile;

(11) Unsaturated imides, e.g., maleimide, N-acryloylacrylamide, N-acetylmethacrylamide, N-propionylmethacrylamide and N-(p-chlorobenzoyl)methacrylamide; and

(12) Unsaturated carboxylic acids, e.g., acrylic acid, methacrylic acid, maleic anhydride and itaconic acid.

When other alkali-soluble resins are the homopolymers or copolymers of apolymerizable monomer having a phenolic hydroxyl group, a polymerizable monomer having a sulfonamido group or a polymerizable monomer having an active imido group, the weight average molecular weight of these homopolymers or copolymers is preferably 2,000 or more and the number average molecular weight is preferably 500 or more, and more preferably the weight average molecular weight is from 5,000 to 300,000 and the number average molecular weight is from 800 to 250,000, and the degree of dispersion (weight average molecular weight/number average molecular weight) is from 1.1 to 10.

Other components which can be used in manufacturing a photosensitive composition as the composition for an image-forming layer according to the present invention are described below.

As the positive photosensitive compositions, compositions having solubility or swelling properties changing in a developing solution before and after exposure can be used in the present invention, and o-quinonediazide compounds can be exemplified as preferred compounds. For example, in the case of positive photosensitive compositions containing an alkali-soluble resin and an o-quinonediazide compound, the o-quinonediazide compound is a compound having at least one o-quinonediazide group, and a compound whose solubility in an aqueous alkali solution changes by actinic light is preferred.

Compounds of various structures are known as such a compound and described in detail in, e.g., J. Kosar, *Light-Sensitive Systems*, pp. 336 to 352, John Wiley & Sons, Inc. (1965). As photosensitive compounds of positive photosensitive compositions, a variety of hydroxyl compounds, sulfonic esters of o-benzoquinonediazide or o-naphthoquinonediazide are particularly preferred.

The examples of o-quinonediazide compounds include esters of 1,2-naphthoquinone-2-diazido-5-sulfonyl chloride and a phenol-formaldehyde resin or cresol-formaldehyde resin; esters of 1,2-naphthoquinone-2-diazido-5-sulfonyl chloride and a pyrogallol-acetone resin as disclosed in U.S. Pat. No. 3,635,709; esters of 1,2-naphthoquinone-2-diazido-5-sulfonyl chloride and a resorcin-benzaldehyde resin as disclosed in Japanese Patent Publication No. 13528/1988; esters of 1,2-naphthoquinone-2-diazido-5-sulfonyl chloride and a resorcin-pyrogallol-acetone co-condensation resin as disclosed in Japanese Patent Publication No. 44257/1987; esters of a polyester terminating in hydroxyl groups with 1,2-naphthoquinone-2-diazido-5-sulfonyl chloride as disclosed in Japanese Patent Publication No. 45127/1981; esters of a homopolymer of N-(4-hydroxyphenyl)methacrylamide or a copolymer of N-(4-hydroxyphenyl)methacrylamide with other polymerizable monomer and 1,2-naphthoquinone-2-diazido-5-sulfonyl chloride as disclosed in Japanese Patent Publication No. 24641/1975; esters of 1,2-naphthoquinone-2-diazido-5-sulfonyl chloride and a bisphenol-formaldehyde resin as disclosed in Japanese Patent Publication No. 29922/1979; esters of a homopolymer of p-hydroxystyrene or a copolymer of p-hydroxystyrene with other polymerizable monomer and 1,2-naphthoquinone-2-diazido-5-sulfonyl chloride and as disclosed in Japanese Patent Publication No. 36043/1977; and esters of 1,2-naphthoquinone-2-diazido-5-sulfonyl chloride and a polyhydroxybenzophenone.

In addition to the above compounds, well-known o-quinonediazide compounds which can be used in the present invention are disclosed in Japanese Patent Laid-Open Nos. 80254/1988, 5737/1983, 111530/1982, 111531/1982, 114138/1982, 142635/1982, 36129/1976, Japanese Patent Publication Nos. 3411/1987, 51459/1987 and 483/1976.

The content of these o-quinonediazide compounds is generally from 5 to 60 wt %, preferably from 10 to 40 wt %, based on the entire solid content of the photosensitive composition.

Cyclic acid anhydrides for increasing sensitivity, printing out agents for obtaining a visible image immediately after exposure, dyes as coloring agents of an image, and other fillers can further be added to a photosensitive composition, if necessary.

For increasing sensitivity, it is preferred to use cyclic acid anhydrides, phenols and organic acids in the photosensitive composition in the present invention.

The examples of cyclic acid anhydrides include, as disclosed in U.S. Pat. No. 4,115,128, phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylmaleic anhydride, succinic anhydride and pyromellitic anhydride.

The examples of phenols include bisphenol A, p-nitrophenol, p-ethoxyphenol, 2,3,4-trihydroxybenzophenone, 4-hydroxybenzophenone, 2,4,4'-trihydroxybenzophenone, 4,4',4"-trihydroxy-triphenylmethane, and 4,4',3",4"-tetrahydroxy-3,5,3',5'-tetramethyltriphenylmethane The examples of organic acids include, as disclosed in Japanese Patent Laid-Open Nos. 88942/1985 and 96755/1990, sulfonic acids, sulfinic acids, alkylsulfuric acids, phosphonic acids, phosphinic acids, phosphoric esters and carboxylic acids, specifically, p-toluenesulfonic acid, dodecylbenzenesulfonic acid, p-toluenesulfinic acid, ethyl sulfate, phenyl phosphonate, phenyl phosphinate, phenyl phosphate, diphenyl phosphate, benzoic acid, isophthalic acid, adipic acid, p-toluic acid, 3,4-dimethoxybenzoic acid, phthalic acid, terephthalic acid, 1,4-cyclohexene-2,2-dicarboxylic acid, erucic acid, lauric acid, n-undecanoic acid, and ascorbic acid can be exemplified.

The content of cyclic acid anhydrides, phenols and organic acids in a photosensitive composition is preferably from 0.05 to 15 wt %, and more preferably from 0.1 to 5 wt %.

As printing out agents for obtaining a visible image immediately after exposure, a photosensitive compound which releases an acid upon exposure and an organic dye which forms a salt with an acid to change a color tone can be used in combination.

The examples of photosensitive compounds releasing an acid upon exposure include, e.g., o-naphthoquinonediazide-4-sulfonic acid halogenide disclosed in Japanese Patent Laid-Open No. 36209/1975; trihalomethyl-2-pyrone and trihalomethyl-s-triazine disclosed in Japanese Patent Laid-Open No. 36223/1978; various o-quinonediazide compounds disclosed in Japanese Patent Laid-Open No. 62444/1980; 2-trihalomethyl-5-aryl-1,3,4-oxadiazole compounds disclosed in Japanese Patent Laid-Open No. 77742/1980; and diazonium salts.

These compounds can be used alone or as mixture, and the addition amount is preferably from 0.3 to 15 wt % based on the total weight of the composition.

In the photosensitive composition according to the present invention, at least one kind of an organic dye which changes a color tone by the interaction with the photolysis product of a compound which generates an acidic substance by photolysis is used.

As such organic dyes, diphenylmethane series, triarylmethane series, thiazine series, oxazine series, phenazine series, xanthene series, anthraquinone series, iminonaphthoquinone series and azomethine series dyes can be used.

The specific examples of such dyes include Brilliant Green, Eosine, Ethyl Violet, Erythrosine B, Methyl Green, Crystal Violet, Basic Fuchsine, Phenolphthalein, 1,3-diphenyltriazine, Alizarin Red S, Thymolphthalein, Methyl Violet 2B, Quinaldine Red, Rose Bengale, Thymolsulfophthalein, Xylenol Blue, Methyl Orange, Orange IV, Diphenylthiocarbazone, 2,7-dichlorofluorescein, Paramethyl Red, Congo Red, Benzopurpurine 4B, α-Naphthyl Red, Nile Blue-2B, Nile Blue-A, Phenacetalin, Methyl Violet, Malachite Green, Parafuchsine, Oil Blue #603 (a product of Orient Kagaku Kogyo Co., Ltd.), Oil Pink #312 (a product of Orient Kagaku Kogyo Co., Ltd.), Oil Red 5B (a product of Orient Kagaku Kogyo Co., Ltd.), Oil Scarlet #308 (a product of Orient Kagaku Kogyo Co., Ltd.), Oil Red OG (a product of Orient Kagaku Kogyo Co., Ltd.), Oil Red RR (a product of Orient Kagaku Kogyo Co., Ltd.), Oil Green #502 (a product of Orient Kagaku Kogyo Co., Ltd.), Spiron Red BEH Special (a product of Hodogaya Kagaku Kogyo Co., Ltd.), Victoria Pure Blue BOH (a product of Hodogaya Kagaku Kogyo Co., Ltd.), Patent Pure Blue (a product of Sumitomo Mikuni Kagaku Kogyo Co., Ltd.), Sudan Blue II (a product of BASF Co., Ltd.) , m-cresol purple, Cresol Red, Rhodamine B, Rhodamine 6G, First Acid Violet R, Sulfo Rhodamine B, Auramine, 4-p-diethylaminophenyliminonaphthoquinone, 2-carboxyanilino-4-p-diethylaminophenyliminonaphthoquinone, 2-carbostearylamino-4-p-dihydroxyethylaminophenyliminonaphthoquinone, p-methoxybenzoyl-p'-diethylamino-o'-methylphenyliminoacetanilide, cyano-p-diethylaminophenyliminoacetanilide, 1-phenyl-3-methyl-4-p-diethylaminophenylimino-5-pyrazolone, and 1-β-naphthyl-4-p-diethylaminophenylimino-5-pyrazolone.

Particularly preferred organic dyes are triarylmethane series dyes. Of triarylmethane series dyes, those having a sulfonic acid compound as a counter anion disclosed in Japanese Patent Laid-Open No. 2934471/1987 and Japanese Patent No. 2969021 are particularly useful.

These dyes can be used alone or as mixture. The addition amount of these dyes is preferably from 0.3 to 15 wt % based on the total weight of the photosensitive composition. These dyes can be used in combination with other dyes and pigments, if necessary, and the amount at that time is 70 wt % or less, preferably 50 wt % or less, based on the total weight of the dyes and pigments.

The present invention can be applied to the following types of lithographic printing plate materials in addition to the above positive type lithographic printing plate precursor (also called a positive type PS plate).
(1) A negative type laser direct drawing lithographic printing plate material containing an alkali-soluble binder, an acid-generating agent and an acid (thermal) crosslinking compound.
(2) A negative type laser direct drawing lithographic printing plate containing a light-to-heat converting agent, a thermal radical generating agent and a radical polymerizable compound.

The alkali-soluble binders described above and conventionally used acid-generating agents can be used in the above (1).

An acid (thermal) crosslinking compound means a compound which is crosslinked in the presence of an acid, e.g., aromatic compounds and heterocyclic compounds poly-substituted with a hydroxymethyl group, an acetoxymethyl group or an alkoxymethyl group, can be exemplified, and preferred examples are compounds obtained by condensation reaction of phenols with aldehydes in the basic condition.

The preferred compounds of the above are, e.g., compounds obtained by condensation reaction of phenols with formaldehyde in the basic condition, compounds obtained from m-resol and formaldehyde in the same manner, compounds obtained from bisphenol A and formaldehyde, compounds obtained from 4,4'-bisphenol and formaldehyde, in addition to the above, compounds disclosed in British Patent 2,082,339 as resol resins can be exemplified.

These acid crosslinking compounds preferably have a weight average molecular weight of from 500 to 100,000 and a number average molecular weight of from 200 to 50,000. Other preferred examples of acid crosslinking compounds include the aromatic compounds substituted with an alkoxymethyl group or an oxiranylmethyl group disclosed in EP-A-0212482, the monomer and oligomer melamine-formaldehyde condensation products, and urea-formaldehyde condensation products disclosed in EP-A-0133216, DE-A-3,634,671 and DE-3,711,264, and the alkoxyl-substituted compounds disclosed in EP-A-0212482. Further, other preferred examples include, e.g., melamine-formaldehyde derivatives having at least two free N-hydroxymethyl, N-alkoxymethyl or N-acyloxymethyl groups. Of these compounds, N-alkoxymethyl derivative is particularly preferred.

Low molecular weight or oligomer silanols can be used as a silicon-containing crosslinking agent. The examples of them are dimethylsilanediol and diphenylsilanediol, and oligomers which are already preliminarily condensed and have these units. For example, those disclosed in EP-A-0377155 can be used.

Of the aromatic compounds and heterocyclic compounds poly-substituted with an alkoxymethyl group, compounds having an alkoxymethyl group at the position contiguous to the hydroxyl group, wherein the alkoxyl group of the alkoxymethyl group has 18 or less carbon atoms, can be exemplified as preferred examples. The particularly preferred examples of the compounds are represented by the following formula (B), (C), (D) or (E):

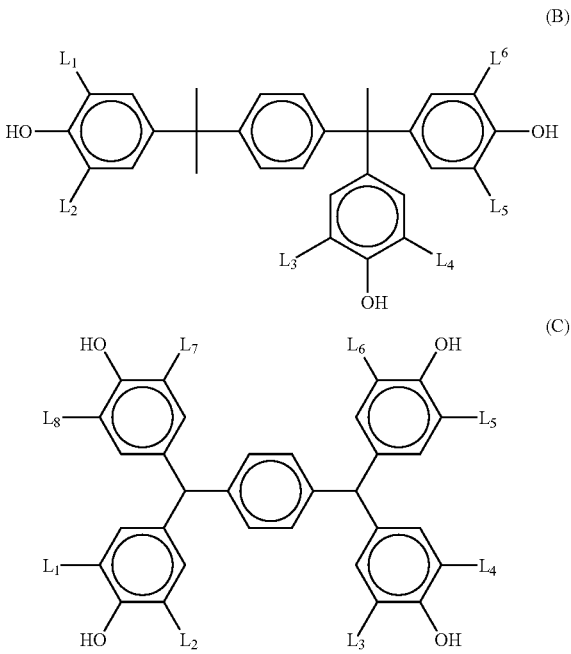

-continued

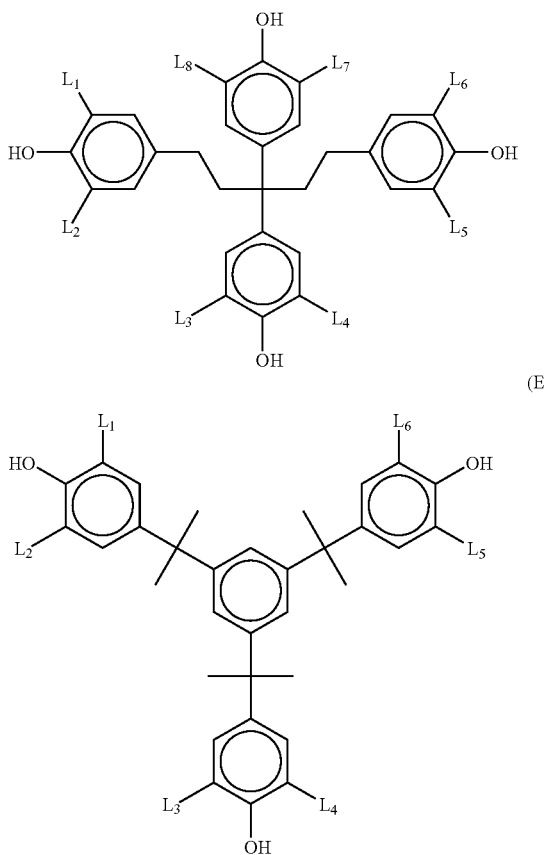

wherein L₁ to L₈, which maybe the same or different, each represents an alkoxymethyl group substituted with an alkoxyl group having 18 or less carbon atoms such as a methoxymethyl or ethoxymethyl group. These compounds are preferred in view of high crosslinking efficiency and capable of improving press life. The thermally crosslinkable compound can be used alone or may be used in combination of two or more.

The acid-crosslinkable compound for use in the present invention is used in an amount of from 5 to 80 wt %, preferably from 10 to 75 wt %, and particularly preferably from 20 to 75 wt %, based on the total solid content of the lithographic printing plate material. When the addition amount of the acid-crosslinkable compound is less than 5 wt %, the durability of the photosensitive layer of the lithographic printing plate obtained is deteriorated, and when the amount exceeds 80 wt %, the storage stability of the material disadvantageously lowers.

The specific materials for use in the above (2) a negative type laser direct drawing lithographic printing plate include a compound containing an addition polymerizable ethylenical double bond, a thermal radical generating agent and a light-to-heat converting agent as the main components.

A compound containing an addition polymerizable ethylenical double bond can be arbitrarily selected from among the compounds having at least one, preferably two or more, ethylene-terminated unsaturated bond. For example, such compounds have the chemical forms of a monomer, a prepolymer, i.e., a dimer, a trimer, and an oligomer, and mixtures of these and polymers of these. As the examples of the monomers and copolymers thereof, esters of unsaturated carboxylic acids (e.g., acrylic acid, methacrylic acid, itaconic acid, crotonic acid, isocrotonic acid, and maleic acid) and aliphatic polyhydric alcohol compounds, amides of unsaturated carboxylic acid and aliphatic polyhydric amine compounds can be exemplified.

The specific examples of the monomers of esters of aliphatic polyhydric alcohol compounds and unsaturated carboxylic acids include, as acrylic esters, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, and polyester acrylate oligomer.

As methacrylic esters, the examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane.

As itaconic esters, the examples include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

As crotonic esters, the examples include ethylene glycol dicrotonate, tetramethylene glycol dicrotonate, pentaerythritol dicrotonate and sorbitol tetradicrotonate.

As isocrotonic esters, the examples include ethylene glycol diisocrotonate, pentaerythritol diisocrotonate and sorbitol tetraisocrotonate.

As maleic esters, the examples include ethylene glycol dimaleate, triethylene glycol dimaleate, pentaerythritol dimaleate and sorbitol tetramaleate. Further, the mixtures of the above ester monomers can also be exemplified.

Further, the specific examples of amide monomers of aliphatic polyhydric amine compounds and unsaturated carboxylic acid include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, and xylylenebis-methacrylamide. As other example, as is disclosed in Japanese Patent Publication No. 41708/1973, a vinyl urethane compound having two or more polymerizable vinyl groups in one molecule can be exemplified, which is obtained by adding a vinyl monomer having a hydroxyl group represented by the following formula (A) to a polyisocyanate compound having two or more isocyanate groups in one molecule.

 (A)

wherein $R_5$ and $R_6$ each represents H or $CH_3$.

Further, polyfunctional acrylates and methacrylates, e.g., urethane acrylates as disclosed in Japanese Patent Laid-Open No. 37193/1976, polyester acrylates, and epoxy acrylates obtained by the reaction of epoxy resins with (meth) acrylic acid as disclosed in Japanese Patent Laid-Open No. 64183/1973, Japanese Patent Publication Nos. 43191/1974 and 30490/1977 can be exemplified. The monomers introduced into *Bulletin of Nippon Setchaku Kyokai*, Vol. 20, No. 7, pp. 300 to 308 (1984) as photosetting monomers and oligomers can be used as well.

The use amount of these compounds containing a double bond is from 5 to 70 wt % (hereinafter abbreviated to merely %), and preferably from 10 to 50%, based on the entire components.

As the thermal radical generating agent, various kinds of conventionally well-known photopolymerization initiators are useful. Further, azobis compounds (e.g., azobisisobutyronitrile) and diazonium compounds can also be used as a thermal polymerization initiator.

The light-to-heat converting agents are the same as described above.

In addition, various additives can be added to the composition of the present invention according to purposes, e.g., various resins having a hydrophobic group for improving the ink-receiving property of the image, e.g., octylphenol-formaldehyde resins, t-butylphenol-formaldehyde resins, t-butylphenol-benzaldehyde resins, rosin-modified novolak resins, and o-naphthoquinonediazidosulfonic esters of these modified novolak resins; and plasticizers for improving the flexibility of a coating film, e.g., dibutyl phthalate, dioctyl phthalate, butyl glycolate, tricresyl phosphate and dioctyl adipate. The addition amount of these additives is preferably from 0.01 to 30 wt % based on the total weight of the composition.

Moreover, known resins can be added to the composition for further improving the abrasion resistance of a film. For example, polyvinyl acetal resins, polyurethane resins, epoxy resins, vinyl chloride resins, nylons, polyester resins and acrylic resins can be used for such a purpose. The resins can be used alone or in combination. The addition amount is preferably from 2 to 40 wt % based on the total weight of the composition.

Surfactants can be added to the photosensitive composition of the present invention for widening development latitude, e.g., nonionic surfactants as disclosed in Japanese Patent Laid-Open Nos. 251740/1987 and 68355/1992, and ampholytic surfactants as disclosed in Japanese Patent Laid-Open Nos. 121044/1984 and 13149/1992 can be added. The specific examples of nonionic surfactants include sorbitan tristearate, sorbitan monopalmitate, sorbitan trioleate, stearic acid monoglyceride, polyoxyethylene sorbitan monooleate and polyoxyethylenenonylphenyl ether, and the specific examples of ampholytic surfactants include alkyldi (aminoethyl)glycine, alkylpolyaminoethylglycine hydrochloride, Amorgen K (trade name, a product of Daiichi Kogyo Seiyaku Co., Ltd., N-tetradecyl-N,N-betaine type), 2-alkyl-N-carboxyethyl-N-hydroxyethylimidazolinium betaine, and Rebon 15 (trade name, a product of Sanyo Kasei Co., Ltd., alkylimidazoline series).

The proportion of the above nonionic and ampholytic surfactants in the photosensitive composition is preferably from 0.05 to 15 wt %, and more preferably from 0.1 to 5 wt %.

Improvement of Coating Surface Quality:

Surfactants, e.g., fluorine surfactants disclosed in Japanese Patent Laid-Open No. 170950/1987 can be added to the photosensitive composition according to the present invention for improving the coating surface quality.

They are used in an amount of preferably from 0.001 to 1.0 wt %, and more preferably from 0.005 to 0.5 wt %, based on the total weight of the photosensitive composition.

Yellow dyes can be added to the photosensitive composition in the present invention, preferably yellow dyes the light absorption of which at 417 nm is 70% or more of that at 436 nm can be added.

When a photosensitive material for a lithographic printing plate is prepared from the photosensitive resin composition containing the fluorine-containing polymer of the present invention, the resin composition is provided as an image-forming layer on an appropriate support in the first place. The photosensitive resin composition containing the fluorine-containing polymer of the present invention is dissolved or dispersed in a single or mixed organic solvents described below, coated on a support and dried.

Any well-known organic solvent can be used as the solvent, but solvents having a boiling point of from 40° C. to 200° C., particularly preferably from 60° C. to 160° C., are preferably used from the viewpoint of advantageousness at drying. As a matter of course, organic solvents in which the surfactants of the present invention are dissolved, are preferably selected.

The examples of the organic solvents include alcohols, e.g., methyl alcohol, ethyl alcohol, n-propyl alcohol, isopropyl alcohol, n-butyl alcohol, isobutyl alcohol, and diacetone alcohol; ketones, e.g., acetone, methyl ethyl ketone, methyl propyl ketone, methyl butyl ketone, methyl amyl ketone, methyl hexyl ketone, diethyl ketone, diisobutyl ketone, cyclohexanone, methylcyclohexanone and acetylacetone; hydrocarbons, e.g., benzene, toluene, xylene, cyclohexane andmethoxybenzene; acetic esters, e.g., ethyl acetate, n-propyl acetate, isopropyl acetate, n-butyl acetate, isobutyl acetate, ethylbutyl acetate and hexyl acetate; halides, e.g., methylene dichloride, ethylene dichloride and monochlorobenzene; ethers, e.g., isopropyl ether, n-butyl ether, dioxane, dimethyl dioxane and tetrahydrofuran; polyhydric alcohols and derivatives thereof, e.g., ethylene glycol, methyl Cellosolve, methyl Cellosolve acetate, ethyl Cellosolve, diethyl Cellosolve, Cellosolve acetate, butyl Cellosolve, butyl Cellosolve acetate, methoxymethoxyethanol, diethylene glycol monomethyl ether, diethylene glycol dimethyl ether, diethylene glycol methylethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether and 3-methyl-3-methoxybutanol; and specific solvents, e.g., dimethyl sulfoxide, N,N-dimethylformamide. These organic solvents are used alone or in combination. The concentration of the solid content in the composition for coating is preferably from 2 to 50 wt %.

Various coating methods are used in the present invention, e.g., roll coating, dip coating, air knife coating, gravure coating, gravure offset coating, hopper coating, blade coating, wire doctor coating, or spray coating. Dry coating weight is preferably from 0.3 to 4.0 g/m². As the coating amount reduces, the exposure amount for obtaining images can be saved but the film strength lowers. As the coating amount increases, the exposure amount increases but the photosensitive film comes to be strong, as a result, when the plate is used as a printing plate, a printing plate having high press life can be obtained.

The photosensitive composition coated on a support is generally dried by hot air. Heating temperature is from 30°

C. to 200° C., and particularly preferably from 40° C. to 140° C. Drying temperature maybe maintained constant or maybe increased stepwise. The removal of moisture of drying air sometimes brings about good results. It is preferred to supply drying air to the coated surface at a rate of from 0.1 to 30 m/sec, particularly preferably from 0.5 to 20 m/sec.

Matting Layer:

It is preferred to provide a matting layer on the thus-provided photosensitive layer surface for shortening the vacuum time at contact exposure using a vacuum printing frame and preventing blurring. Specifically, the coating methods of a matting layer as disclosed in Japanese Patent Laid-Open No. 125805/1975, Japanese Patent Publication Nos. 6582/1982 and 28986/1986, and a method of fusing solid particles by heat as disclosed in Japanese Patent Publication No. 62337/1987 are used.

A support for use in a photosensitive lithographic printing plate is a plate having dimensional stability and supports so far been used as supports of lithographic printing plates can be preferably used.

The examples of such supports include paper; paper laminated with plastics (e.g., polyethylene, polypropylene and polystyrene); metal plates, e.g., aluminum (including aluminum alloys), zinc, iron, and copper; plastic films, e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal; and paper or plastic films laminated or deposited with metals as above; and an aluminum plate is particularly preferably used. Aluminum plates include a pure aluminum plate and an aluminum alloy plate. Various aluminum alloys can be used, e.g., alloys of aluminum with metals such as silicon, copper, manganese, magnesium, chromium, zinc, lead, bismuth, or nickel. These compositions include a negligible amount of impurities in addition to a certain amount of iron and titanium.

A support is subjected to surface treatment, if necessary. For example, in the case of a photosensitive lithographic printing plate, the surface of the support is subjected to hydrophilization treatment. In the case of a metal support, in particular, a support having an aluminum surface, it is preferred to perform surface treatment such as graining treatment, immersion treatment in an aqueous solution of sodium silicate, potassium zirconium acid fluoride or phosphate, or anodic oxidation treatment. Further, as disclosed in U.S. Pat. No. 2,714,066, an aluminum plate subjected to immersion treatment in an aqueous sodium silicate solution after graining treatment, or an aluminum plate surface treated by immersion in an aqueous solution of alkali metal silicate after anodic oxidation treatment as disclosed in U.S. Pat. No. 3,181,461 are also preferably used.

Anodic oxidation treatment is carried out by turning on electricity with the aluminum plate being the anode in an electrolytic solution comprising alone or combination of two or more of an aqueous solution or nonaqueous solution of an inorganic acid such as phosphoric acid, chromic acid, sulfuric acid, boric acid, etc., or an organic acid such as oxalic acid, sulfamic acid, etc., or salts of these acids.

Electrodeposition of silicate as disclosed in U.S. Pat. No. 3,658,662 is also useful. These hydrophilization treatments are performed for preventing harmful reactions of a support with a photosensitive composition provided on the support, or for improving the adhesion of the support with the photosensitive layer, in addition to making the support surface hydrophilic. Prior to surface roughening of an aluminum plate by graining, if desired, the surface of the aluminum plate may be subjected to pre-treatment to remove a rolling oil from the plate surface or to expose a clean aluminum plate surface.

In general, solvents such as trichlene and surfactants are used in degreasing treatment for removing a rolling oil, and alkali etching agents, e.g., sodium hydroxide and potassium hydroxide, are widely used for exposing clean surface.

As surface graining methods, any of mechanical, chemical and electrochemical methods can be used. Mechanical methods include a ball abrading method, a blasting method, and a brushing method in which water dispersion slurry of an abrasive such as pumice or the like is rubbed on the surface of a plate with a nylon brush, as the chemical method, a method of immersion in a saturated aqueous solution of an aluminum salt of a mineral acid as disclosed in Japanese Patent Laid-Open No. 31187/1979 is preferred, and as the electrochemical method, a method of performing alternating current electrolysis in an acid electrolytic solution of hydrochloric acid, nitric acid or combination of these acids is preferably used. Of these surface roughening methods, a method of combining mechanical roughening with electrochemical roughening as disclosed in Japanese Patent Laid-Open No. 137993/1980 is preferred because strong adhesion of a sensitized image to a support can be achieved. Surface graining as described above is preferably performed so as to reach the central line surface roughness (Ra) of the surface of an aluminum plate of from 0.3 to 1.0 μm. The aluminum plate thus surface-treated is subjected to washing and chemical etching, if necessary.

An etching solution is generally selected from among aqueous solutions of base or acid for dissolving aluminum. In this case, an etching solution is selected so that a film different from the aluminum derived from the ingredient of the etching solution is not formed on the etched surface. The examples of preferred etching agents include, as basic substances, sodium hydroxide, potassium hydroxide, trisodium phosphate, disodium phosphate, tripotassium phosphate, and dipotassium phosphate; and as acid substances, sulfuric acid, persulfuric acid, phosphoric acid, hydrochloric acid and salts thereof. Salts of metal shaving a lower tendency to ionization than aluminum, e.g., zinc, chromium, cobalt, nickel and copper are not preferred because an unnecessary film is formed on the etched surface. The concentration and temperature of these etching agents are most preferably set up so that the dissolution rate of the aluminum or alloy thereof to be used falls within the range of from 0.3 to 40 $g/m^2$ per immersion time of one hour, but lower than that or higher than that may also be used.

Etching is performed by immersing an aluminum plate in an etching solution or coating the etching solution on the aluminum plate, and it is preferred to perform etching so that the etching amount becomes from 0.5 to 10 $g/m^2$. Since the etching velocity is fast with the above etching agents, it is preferred to use a basic aqueous solution. In this case, since smutting is generated, desmutting treatment is generally performed. As acids for use in desmutting treatment, nitric acid, sulfuric acid, phosphoric acid, chromic acid, hydrofluoric acid and borofluoric acid are used. The etching-treated aluminum plate is washed with water and subjected to anodic oxidation, if necessary. Anodic oxidation can be effected by conventionally used methods in this field.

Specifically, by applying a direct or alternating electric current to an aluminum plate in an aqueous solution or nonaqueous solution comprising single or combination of two or more of sulfuric acid, phosphoric acid, chromic acid, oxalic acid, sulfamic acid or benzenesulfonic acid, an anodic oxide film can be formed on the surface of the aluminum support.

Treatment conditions of anodic oxidation cannot be determined unconditionally as conditions fluctuate variously depending upon the electrolytic solution to be used, but generally it is preferred that the concentration of an electrolytic solution is from 1 to 80 wt %, the temperature is from 5 to 70° C., the electric current density is from 0.5 to 60 ampere/dm$^2$, the voltage is from 1 to 100 V, and the electrolytic time is from 30 seconds to 50 minutes. Of these anodic oxidation treatments, the method of performing anodic oxidation in sulfuric acid at high electric current density as disclosed in British Patent 1,412,768, and the method of performing anodic oxidation with phosphoric acid as the electrolytic bath disclosed in U.S. Pat. No. 3,511,661 are particularly preferred. The thus-roughened and further anodically oxidized aluminum plate may be hydrophilized, if necessary. As the preferred examples thereof, there are methods of treatment with alkali metal silicate, e.g., an aqueous solution of sodium silicate as disclosed in U.S. Pat. Nos. 2,714,066 and 3,181,461, treatment with potassium fluorozirconate as disclosed in Japanese Patent Publication No. 22063/1961, and treatment with polyvinylsulfonic acid as disclosed in U.S. Pat. No. 4,153,461.

Organic Subbing Layer (i.e., Organic Undercoating Layer):

It is preferred that the photosensitive lithographic printing plate according to the present invention is provided with an organic subbing layer before coating a photosensitive layer in view of the reduction of the photosensitive layer remaining on the non-image area. The organic compounds which are used in such a subbing layer are selected from carboxymethyl cellulose, dextrin, gum arabic, organic phosphonic acid, e.g., phosphonic acids having an amino group, such as 2-aminoethylphosphonic acid, phenylphosphonic acid which may have a substituent, naphthylphosphonic acid, alkylphosphonic acid, glycerophosphonic acid, methylenediphosphonic acid, and ethylenediphosphonic acid, organic phosphoric acid, e.g., phenylphosphoric acid which may have a substituent, naphthylphosphoric acid, alkylphosphoric acid, and glycerophosphoric acid, organic phosphinic acid, e.g., phenylphosphinic acid which may have a substituent, naphthylphosphinic acid, alkylphosphinic acid, and glycerophosphinic acid, amino acids, e.g., glycine and β-alanine, and amine hydrochloride having a hydroxyl group such as triethanolamine hydrochloride. These compounds may be used in combination of two or more.

Further, at least one compound selected from among high molecular weight compounds having the structural unit represented by poly(p-vinylbenzoic acid) in the molecule can be used in the present invention. More specifically, copolymers of p-vinylbenzoic acid and vinylbenzyl triethylammonium salt, and copolymers of p-vinylbenzoic acid and vinylbenzyl trimethylammonium chloride are exemplified.

An organic subbing layer can be provided by the following methods, that is, a solution obtained by dissolving the above-described organic compounds in water or a single or mixed organic solvent, e.g., methanol, ethanol or methyl ethyl ketone, is coated on an aluminum plate, and dried to provide an organic subbing layer (i.e., an organic undercoating layer). Alternatively, an aluminum plate is immersed in a solution obtained by dissolving the above-described organic compounds in water or a single or mixed organic solvent such as methanol, ethanol or methyl ethyl ketone, thereby the organic compounds are adsorbed onto the aluminum plate, the plate is washed with water or the like, and then dried to provide an organic subbing layer.

According to the former method, the solution containing the above organic compounds in concentration of from 0.005 to 10 wt % can be coated by various means. For example, any method of bar coating, rotary coating, spray coating and curtain coating may be used. In the latter method, the concentration of the solution is from 0.01 to 20 wt %, preferably from 0.05 to 5 wt %, the immersion temperature is from 20 to 90° C., preferably from 25 to 50° C., and the immersion time is from 0.1 second to 20 minutes, and preferably from 2 seconds to 1 minute.

The pH of the solution is adjusted to 1 to 12 with basic substance, e.g., ammonia, triethylamine, or potassium hydroxide, or acidic substance, e.g., hydrochloric acid or phosphoric acid. A yellow dye can be added to the solution for improving tone reproducibility of the photosensitive lithographic printing plate. Further, a compound represented by the following formula (a) can be added to this solution:

(HO)$_x$—R$_5$—(COOH)$_y$     (a)

wherein R$_5$ represents an arylene group having 14 or less carbon atoms, which may have a substituent; and x and y each represents an integer of from 1 to 3. The specific examples of the compounds represented by formula (a) include 3-hydroxybenzoic acid, 4-hydroxybenzoic acid, salicylic acid, 1-hydroxy-2-naphthoic acid, 2-hydroxy-1-naphthoic acid, 2-hydroxy-3-naphthoic acid, 2,4-dihydroxybenzoic acid, and 10-hydroxy-9-anthracenecarboxylic acid.

The dry coating weight of the organic subbing layer is generally from 1 to 100 mg/m$^2$, and preferably from 2 to 70 mg/m$^2$. If the coating weight is less than 2 mg/m$^2$, sufficient press life cannot be obtained, and when it is more than 100 mg/m$^2$, press life similarly lowers.

Back Coating Layer:

The back surface of a support is provided with a back coating layer, if necessary. Coating layers comprising a metallic oxide obtained by hydrolyzing and polycondensing the organic high molecular weight compounds disclosed in Japanese Patent Laid-Open No. 45885/1993 and the organic or inorganic metallic compounds disclosed in Japanese Patent Laid-Open No. 35174/1994 are preferably used as such a back coating layer. Of these coating layers, alkoxyl compounds of silicon such as Si(OCH$_3$)$_4$, Si(OC$_2$H$_5$)$_4$, Si(OC$_3$H$_7$)$_4$ and Si(OC$_4$H$_9$)$_4$ are inexpensive and easily available, and coating layers of the metallic oxides obtained from these compounds are excellent in resistance against developing solutions and particularly preferred.

The thus-obtained lithographic printing plate is generally subjected to image exposure and development process. As the light sources of actinic light used for image exposure, light sources having light emission wavelength at near infrared to infrared are preferred, and a solid state laser and a semiconductor laser are particularly preferred.

Developing solutions containing (a) at least one kind of sugar selected from non-reducing sugars, and (b) at least one kind of base, and having pH of from 9.0 to 13.5 are preferably used as a developing solution for a lithographic printing plate using the photosensitive composition according to the present invention. This developing solution is described in detail below. Unless otherwise indicated, a developing solution means in this specification a developing initiator (a developing solution in a narrow sense) and a developing replenisher.

This developing solution preferably comprises at least one compound selected from non-reducing sugars and at least one base as the main components, and the pH of the solution is preferably within the range of from 9.0 to 13.5.

Such non-reducing sugars are sugars which do not have a free aldehyde group and a ketone group and do not show reducing property. The non-reducing sugars are classified to a trehalose type oligosaccharide in which reducing groups are bonded to each other, a glycoside in which reducing groups of sugars and nonsugars are bonded to each other, and a sugar alcohol obtained by reducing sugars by hydrogenation, and all of these non-reducing sugars can be preferably used. Trehalose type oligosaccharides include succharose and trehalose, glycosides include alkyl glycoside, phenol glycoside, and mustard oil glycoside, and sugar alcohols include D- and L-arabitol, ribitol, xylitol, D- and L-sorbitol, D- and L-mannitol, D- and L-iditol, D- and L-talitol, dulicitol, and allodulcitol. In addition, maltitol obtained by hydrogenation of disaccharide and the reductant (reduced starch syrup) obtained by hydrogenation of oligosaccharide are preferably used.

Particularly preferred non-reducing sugars of these are sugar alcohols and succharose. Above all, D-sorbitol, succharose and reduced starch syrup are preferred for the reasons that they show buffer action in an appropriate pH range and inexpensive.

Such non-reducing sugars can be used alone or in combination of two or more, and the proportion of non-reducing sugars in a developing solution is preferably from 0.1 to 30 wt %, and more preferably from 1 to 20 wt %.

When the concentration of non-reducing sugars is less than this range, sufficient buffer action cannot be obtained, while when the concentration is higher than this range, high concentration of developing solutions is difficult to obtain and the problem of the production cost increase arises. When reducing sugars are used in combination with bases, the developing solution discolors to brown with the lapse of time and pH gradually decreases, which results in the reduction of developing property.

Alkali agents so far been known can be used as a base to be used in combination with non-reducing sugars. The examples of such alkali agents include an inorganic alkali agent, e.g., sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogen carbonate, potassium hydrogen carbonate, ammonium hydrogen carbonate, sodium borate, potassium borate, and ammonium borate. In addition to these inorganic alkali agents, organic alkali agents, e.g., monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine are also used.

These alkali agents are used alone or in combination of two or more. Of these alkali agents, sodium hydroxide and potassium hydroxide are preferred for the reason that the pH adjustment in a wide pH range becomes possible by adjusting the amount of these alkali agents based on the non-reducing sugars. Further, trisodium phosphate, tripotassium phosphate, sodium carbonate and potassium carbonate are also preferred due to their own buffer action.

These alkali agents are added so as to reach the pH 9.0 to 13.5 of a developing solution, and the addition amount is determined depending upon the desired pH, the kind and the addition amount of the non-reducing sugars to be used. The more preferred pH range is from 10.0 to 13.2.

An alkaline buffering solution comprising weak base and weak acid other than sugars can further be used in a developing solution in combination. Weak acids for use as such a buffering solution preferably have a dissociation constant (pKa) of from 10.0 to 13.2.

Such weak acids are selected from the weak acids described, e.g., in *Ionization Constants of Organic Acids in Aqueous Solution*, Pergamon Press Co. The examples of weak acids include alcohols, e.g., 2,2,3,3-tetrafluoropropanol-1 (pKa: 12.74), trifluoroethanol (pKa: 12.37), and trichloroethanol (pKa: 12.24); aldehydes, e.g., pyridine-2-aldehyde (pKa: 12.68), and pyridine-4-aldehyde (pKa: 12.05); compounds having a phenolic hydroxyl group, e.g., salicylic acid (pKa: 13.0), 3-hydroxy-2-naphthoic acid (pKa: 12.84), catechol (pKa: 12.6), gallic acid (pKa: 12.4), sulfosalicylic acid (pKa: 11.7), 3,4-dihydroxysulfonic acid (pKa: 12.2), 3,4-dihydroxybenzoic acid (pKa: 11.94), 1,2,4-trihydroxybenzene (pKa: 11.82), hydroquinone (pKa: 11.56), pyrogallol (pKa: 11.34), o-cresol (pKa: 10.33), resorcinol (pKa: 11.27), p-cresol (pKa: 10.27), and m-cresol (pKa: 10.09); oximes, e.g., 2-butanoneoxime (pKa: 12.45), acetoxime (pKa: 12.42), 1,2-cycloheptanedionedioxime (pKa: 12.3), 2-hydroxybenzaldehydeoxime (pKa: 12.10), dimethylglyoxime (pKa: 11.9), ethanediamidodioxime (pKa: 11.37), and acetophenoneoxime (pKa: 11.35); nucleic acid-relating substances, e.g., adenosine (pKa: 12.56), inosine (pKa: 12.5), guanine (pKa: 12.3), cytosine (pKa: 12.2), hypoxanthine (pKa: 12.1), and xanthine (pKa: 11.9); in addition to the above, diethylaminomethylsulfonic acid (pKa: 12.32), 1-amino-3,3,3-trifluorobenzoic acid (pKa: 12.29), isopropylidenedisulfonic acid (pKa: 12.10), 1,1-ethylidenediphosphonic acid (pKa: 11.54), 1,1-ethylidenediphosphonic acid-1-hydroxy (pKa: 11.52), benzimidazole (pKa: 12.86), thiobenzamide (pKa: 12.8), picolinethioamide (pKa: 12.55), and barbituric acid (pKa: 12.5).

Of these weak acids, sulfosalicylic acid and salicylic acid are preferred. Sodium hydroxide, ammonium hydroxide, potassium hydroxide, and lithium hydroxide are preferably used as bases to be used in combination with a weak acid. These alkali agents are used alone or in combination of two or more. These alkali agents are used by adjusting pH in a desired range by the concentration and combination.

Various surfactants and organic solvents can be added to a developing solution according to necessity with a view to accelerating development, dispersing developer scum, and increasing the affinity to ink of the image area of a printing plate. As preferred surfactants, anionic, cationic, nonionic, and ampholytic surfactants can be exemplified.

The preferred examples of surfactants include nonionic surfactants, e.g., polyoxyethylene alkyl ethers, polyoxyethylene alkylphenyl ethers, polyoxyethylene polystyrylphenyl ethers, polyoxyethylene polyoxypropylene alkyl ethers, glycerol fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylenealkylamine, triethanolamine fatty acid ester, and trialkylamine oxide; fatty acid salts, abietates, hydroxyalkanesulfonates, alkanesulfonates, dialkylsulfosuccinates, straight chain alkylbenzenesulfonates, branched chain alkylbenzenesulfonates, alkylnaphthalenesulfonates, alkylphenoxypolyoxyethylenepropylsulfonates, polyoxyethylene alkylsulfophenyl ethers, N-methyl-N-oleyltaurine sodium salt, N-alkylsulfosuccinic acid monoamido disodium salt, petroleum sulfonates, sulfated tallow, fatty acid alkyl ester sulfates, alkylsulfates, polyoxyethylene alkyl ether sulfates, fatty acid monoglyceride sulfates, polyoxyethylene alkylphenyl ether sulfates, polyoxyethylene styrylphenyl ether sulfates, alkylphosphates, polyoxyethylene alkyl ether phosphates, polyoxyethylene alkylphenyl ether phosphates, partially saponified products of styrene-maleic anhydride copolymers, partially saponified products of olefin-maleic anhydride copolymers, anionic surfactants, e.g., condensation products of naphthalenesulfonate-formaldehyde, alkylamines, tertiary ammonium salts, e.g., tetrabutylammonium bromide, cationic surfactants, e.g., polyoxyethylenealkylamines and polyethylenepolyamine derivatives, ampholytic surfactants, e.g., carboxybetaines, aminocarboxylic acids, sulfobetaines, aminosulfates, and imidazolines. Of the above surfactants, "polyoxyethylene" can include polyoxyalkylene such as polyoxymethylene, polyoxypropylene and polyoxybutylene, and surfactants thereof are also included.

The more preferred surfactants are fluorine surfactants which contain a perfluoroalkyl group in the molecule. The examples of such fluorine surfactants include an anionic type, e.g., perfluoroalkylcarboxylate, perfluoroalkylsulfonates and perfluoroalkylphosphates, an ampholytic type, e.g., perfluoroalkylbetaine, a cationic type, e.g., perfluoroalkyltrimethylammonium salt, and a nonionic type, e.g., perfluoroalkylamine oxide, perfluoroalkylethylene oxide adducts, oligomers containing a perfluoroalkyl group and a hydrophilic group, oligomers containing a perfluoroalkyl group and a lipophilic group, oligomers containing a perfluoroalkyl group, a hydrophilic group, and a lipophilic group, and urethane containing a perfluoroalkyl group and a lipophilic group. These surfactants can be used alone or in combination of two or more, and they are added to a developing solution in the range of preferably from 0.001 to 10 wt %, and more preferably from 0.01 to 5 wt %.

Various development stabilizers can be used in a developing solution. The polyethylene glycol adducts of sugar alcohols disclosed in Japanese Patent Laid-Open No. 282079/1994, tetraalkylammonium salts such as tetrabutylammonium hydroxide, phosphonium salts such as tetrabutylphosphonium bromide, and iodonium salts such as diphenyliodonium chloride are exemplified as the preferred examples of such development stabilizers. Further, the anionic surfactants and ampholytic surfactants disclosed in Japanese Patent Laid-Open No. 51324/1975, the water-soluble cathionic polymers disclosed in Japanese Patent Laid-Open No. 95946/1980, and the water-soluble ampholytic high molecular weight electrolyte disclosed in Japanese Patent Laid-Open No. 142528/1981 can also be exemplified.

In addition to the above compounds, the following compounds can be exemplified as development stabilizers, e.g., the adduct of organic boron compounds with alkylene glycol disclosed in Japanese Patent Laid-Open No. 84241/1984, the polyoxyethylene-polyoxypropylene block polymer type water-soluble surfactants disclosed in Japanese Patent Laid-Open No. 111246/1985, the polyoxyethylene-polyoxypropylene-substituted alkylenediamine compounds disclosed in Japanese Patent Laid-Open No. 129750/1985, the polyethylene glycol having a weight average molecular weight of 300 or more disclosed in Japanese Patent Laid-Open No. 215554/1986, the fluorine-containing surfactants having a cationic group disclosed in Japanese Patent Laid-Open No. 175858/1988, the water-soluble ethylene oxide adducts obtained by adding 4 mols or more of ethylene oxide to acid or alcohol disclosed in Japanese Patent Laid-Open No. 39157/1990, and water-soluble polyalkylene compounds.

An organic solvent can be added to a developing solution, if necessary. Such an organic solvent has solubility in water of 10 wt % or less, preferably 5 wt % or less, e.g., 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 3-methylcyclohexanol, 4-methylcyclohexanol, N-phenylethanolamine, and N-phenyldiethanolamine can be exemplified.

The content of an organic solvent is from 0.1 to 5 wt % based on the total weight of the working solution. The use amount of an organic solvent is intimately related with the use amount of a surfactant, and it is preferred to increase the amount of a surfactant as the amount of an organic solvent increases. This is because when the amount of a surfactant is scarce and the amount of an organic solvent is predominant, the organic solvent does not dissolve completely, and good developing property cannot be ensured.

Moreover, a reducing agent can be added to a developing solution. A reducing agent is added in order to prevent a printing plate from being contaminated, and a reducing agent is particularly effective when a negative type lithographic printing plate containing a photosensitive diazonium salt compound is developed. As preferred organic reducing agents, phenol compounds, e.g., thiosalicylic acid, hydroquinone, metol, methoxyquinone, resorcine, and 2-methylresorcine, and amine compounds, e.g., phenylenediamine and phenylhydrazine can be exemplified. The examples of more preferred inorganic reducing agents include sodium salt, potassium salt and ammonium salt of inorganic acid such as sulfurous acid, sulfurous acid hydroacid, phosphorous acid, phosphorous acid hydroacid, phosphorous acid dihydroacid, thiosulfuric acid, and dithionic acid.

Of these reducing agents, sulfite is particularly excellent in contamination preventing effect. The amount of these reducing agents are from 0.05 to 5 wt % based on the developing solution on use.

Further, a developing agent can contain an organic carboxylic acid. Preferred organic carboxylic acids are aliphatic and aromatic carboxylic acids having from 6 to 20 carbon atoms. The specific examples of aliphatic carboxylic acids include caproic acid, enanthylic acid, caprylic acid, lauric acid, myristic acid, palmitic acid, and stearic acid, and alkanoic acid having from 8 to 12 carbon atoms is particularly preferred. Further, unsaturated fatty acids having a double bond in the carbon chain can be used, or the carbon chain may be branched. The examples of aromatic carboxylic acids include compounds in which a benzene ring, naphthalene ring, or anthracene ring is substituted with a carboxylic group, specifically o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, and 2-naphthoic acid, and hydroxynaphthoic acid is particularly effectively used.

It is preferred to use these aliphatic and aromatic carboxylic acids as sodium salt, potassium salt or ammonium salt for heightening water solubility. The content of carboxylic acids for use in a developing solution is not particularly limited, but when their content is lower than 0.1 wt %, sufficient effect cannot be obtained, while when it is more than 10 wt %, not only further effect cannot be obtained but the solubility of other additives is sometimes hindered. Accordingly, a preferred content of an organic carboxylic acid is from 0.1 to 10 wt % based on the working developing solution, more preferably from 0.5 to 4 wt %.

Further, if necessary, a developing solution can contain antiseptics, coloring agents, thickeners, defoaming agents and (hard) water softeners. The examples of the water softeners include, e.g., polyphosphoric acid, and the sodium salt, potassium salt and ammonium salt thereof, aminopolycarboxylic acid, e.g., ethylenediaminetetraacetic acid, diethylenetriaminepentaacetic acid, triethylenetraminehexaacetic acid, hydroxyethylethylenediaminetriacetic acid, nitrilotriacetic acid, 1,2-diaminocyclohexanetetraacetic acid, and 1,3-diamino-2-propanoltetraacetic acid, and the sodium salt, potassium salt and ammonium salt thereof, aminotri(methylenephosphonic acid), ethylenediaminetetra (methylenephosphonic acid), diethylenetriaminepenta(methylenephosphonic acid), triethylenetetraminehexa(methylenephosphonic acid), hydroxyethylethylenediaminetri (methylenephosphonic acid), and 1-hydroxyethane-1,1-diphosphonic acid, and the sodium salt, potassium salt and ammonium salt thereof.

The optimal value of water softeners varies according to the chelation, the hardness and the amount of hard water to be used but is generally from 0.01 to 5 wt %, more preferably from 0.01 to 0.5 wt %, based on the working developing solution. When the addition amount is less than this range, the expected effect cannot be obtained sufficiently, and when the amount is higher than this range, adverse effects on the image area comes to appear, such as blank color area. The remainder of the component of a developing solution is water. From the viewpoint of transportation, it is convenient to prepare a developing solution in concentration with less water content to dilute with water at use. The concentration in this case is preferably such that each component does not separate or precipitate.

The developing solution disclosed in Japanese Patent Laid-Open No. 282079/1994 can also be used as a developing solution for a lithographic printing plate using the photosensitive composition according to the present invention. This is a developing solution containing silicic acid alkali metal salt having an $SiO_2/M_2O$ (M represents alkali metal) molar ratio of from 0.5 to 2.0, and a water-soluble ethylene oxide adduct obtained by adding 5 mols or more ethylene oxide to a sugar alcohol having 4 or more hydroxyl groups. The sugar alcohol is a polyhydric alcohol corresponding to the alcohol in which the aldehyde group and the ketone group of the sugar are reduced to make a primary alcohol and a secondary alcohol. The specific examples of sugar alcohols include D- and L-threitol, erythritol, D- and L-arabitol, ribitol, xylitol, D- and L-sorbitol, D- and L-mannitol, D- and L-iditol, D- and L-talitol, dulicitol, and allodulcitol. Further, di-, tri-, tetra-, penta- and hexa-glycerol which are condensation products of sugar alcohol can also be exemplified. The above water-soluble ethylene oxide adduct can be obtained by adding 5 mols or more ethylene oxide to 1 mol of sugar alcohol. Further, if necessary, the ethylene oxide adduct may be block copolymerized with a propylene oxide in the range so as not to hinder the solubility. The ethylene oxide adducts may be used alone or in combination of two or more.

The addition amount of water-soluble ethylene oxide adducts is preferably from 0.001 to 5 wt % based on the developing solution (working solution), more preferably from 0.001 to 2 wt %.

Various surfactants and organic solvents can be added to a developing solution according to necessity with a view to accelerating development, dispersing developer scum, and increasing the affinity to ink of the image area of a printing plate.

A PS plate development treated with a developing solution having the above composition is post-treated with a washing water, a rinsing water containing a surfactant, a finisher or a protective gum solution containing gum arabic and starch derivatives as main components. In the post-treatment of the PS plate according to the present invention, these treatments are used in various combinations.

Automatic processors for PS plates are prevailingly used in the plate-making and printing industries for the purpose of rationalization and standardization of plate-making works in recent years. Such automatic processors generally consist of a development part and a post-treatment part and equipped with a transporting unit of a PS plate, processing solution tanks, and spraying units. Development and post-treatment are effected by spraying each processing solution pumped up to a PS plate by means of a spray nozzle while conveying an exposed PS plate horizontally. A method of development processing a PS plate while transporting with the PS plate being immersed in a processing solution tank filled with a processing solution by means of guide rolls in solution, and a method of washing the plate surface after development by supplying a certain small amount of a washing water and reusing the waste solution as a diluent solution of a concentrated developing solution are also known.

In such automatic processing, processing can be carried out with replenishing each replenisher to each processing solution corresponding to the processing amount, the operating time, etc. Moreover, a nonreturnable system in which processing is carried out with substantially a virgin solution can also be applied. A lithographic printing plate obtained through these processes is loaded on an offset printing machine and used for printing a lot of sheets.

EXAMPLE

The present invention is described in detail below with reference to the specific examples, but it should not be construed as the present invention is limited thereto.

Examples I-1 to I-7 and Comparative Examples I-1 and I-2

Formation of Support

A JIS A 1050 aluminum sheet was subjected to surface graining treatment with a rotary nylon brush and a suspension of pumice stone and water as the abrasive. Surface roughness (central line average surface roughness) at this time was 0.5 μm. After washing with water, the sheet was immersed in a 10% sodium hydroxide aqueous solution heated at 70° C. and etching was performed so that the dissolving amount of the aluminum reached 6 g/m². After washing with water, the sheet was immersed in a 30% nitric acid aqueous solution for 1 minute to be neutralized, and then thoroughly washed with water. Subsequently, the sheet was subjected to electrolytic surface roughening treatment in a 0.7% nitric acid aqueous solution using rectangular alternating wave form voltage of the anode time voltage of 13 V and the cathode time voltage of 6 V for 20 seconds. The surface of the sheet was washed by immersion in a 20% sulfuric acid solution at 50° C., and then washed with water.

The surface-roughened aluminum sheet was subjected to porous anodic oxide film-forming treatment in a 20% sulfuric acid aqueous solution using direct current. Electrolysis was conducted at electric current density of 5 A/dm$^2$ and a substrate having an anodic oxide film having a weight of 4.0 g/m$^2$ was formed on the surface by controlling the electrolysis time. The substrate was treated in a saturated steam chamber at 100° C., 1 atm. for 10 seconds, thereby Substrate (a) having a sealing rate of 60% was obtained.

Substrate (a) was subjected to the treatment of surface-hydrophilization in a 2.5 wt % aqueous solution of sodium silicate at 30° C. for 10 seconds, and then a subbing layer coating solution having the composition shown below was coated on Substrate (a) and the coated layer was dried at 80° C. for 15 seconds, thereby Support [A] for a lithographic printing plate was obtained. The dry coating weight was 15 mg/m$^2$.

Subbing Layer Coating Solution

| | |
|---|---|
| Copolymer having a molecular weight of 28,000 shown below —(CH$_2$—CH)$_{85}$— —(CH$_2$—CH)$_{15}$— COOH  CH$_2$N$^+$Et$_3$ Cl$^-$ molecular weight: 28,000 | 0.3 g |
| Methanol | 100 g |
| Water | 1 g |

Formation of Recording Layer

Photosensitive solution 1 having the composition shown below was coated on Support [A] having the subbing layer in a coating amount of 1.8 g/m$^2$ and the coated layer was dried to form a photosensitive layer (a recording layer), thereby lithographic printing plate Precursor 1 was obtained.

Photosensitive Solution 1

| | |
|---|---|
| Novolak resin (weight average molecular weight: 7,000, unreacted cresol: 0.5 wt %) | 1.0 g |
| Polymer according to the present invention | shown in Table I-1 |
| Cyanine Dye A having the following structural formula | 0.1 g |
| Phthalic anhydride | 0.05 g |
| p-Toluenesulfonic acid | 0.002 g |
| Ethyl Violet having 6-hydroxy-β-naphthalene sulfonic acid as the counter ion | 0.02 g |
| Fluorine-containing polymer (Megafac F-176 (20%), manufactured by Dainippon Ink & Chemicals Inc.) | 0.02 g |
| Fluorine-containing polymer (Megafac MCF-770-F (10%), manufactured by Dainippon Ink & Chemicals Inc.) | 0.06 g |
| Methyl ethyl ketone | 12 g |

Evaluation of Development Latitude

A test pattern was imagewise drawn on the obtained lithographic printing plate precursor by using Trendsetter (manufactured by Creo Co.) at a beam intensity of 9 w and a drum rotation speed of 150 rpm.

The exposed lithographic printing plate precursor on the above condition was subjected to development by PS processor 900 H (manufactured by Fuji Photo Film Co., Ltd.) charged with alkali developing solution A having the composition shown below with maintaining the liquid temperature at 30° C. for 20 seconds.

After that, processing was repeated with gradually diluting the developing solution with water. Whether or not there were staining and coloring attributable to the residual film of the recording layer due to development failure was observed, and the electrical conductance of the developing solution which resulted in good development was measured.

The results obtained are shown in Table I-1 below. The developing solution whose difference between the upper limit value and the lower limit value was great was evaluated as excellent in development latitude.

Composition of Alkali Developing Solution A

| | |
|---|---|
| SiO$_2$·K$_2$O (K$_2$O/SiO$_2$ = 1/1 (molar ratio) | 4.0 mass % (i.e., weight %) |
| Citric acid | 0.5 mass % |
| Polyethylene glycol lauryl ether (weight average molecular weight: 1,000) | 0.5 mass % |
| Water | 95.0 mass % |

Example I-8 to I-14 and Comparative Example I-3 and I-4

Photosensitive solution 2A having the composition shown below was coated on the same Support [A] as used in Example 1 and the coated layer was dried at 100° C. for 2 minutes, thereby Layer (A) was formed. The dry coating weight was 1.04 g/m$^2$.

Photosensitive solution 2B having the composition shown below was coated thereon and dried at 100° C. for 2 minutes to form Layer (B) (the upper layer), thereby lithographic printing plate Precursor 2 was formed. The total dry coating amount of the photosensitive layers was 1.2 g/m$^2$.

| | |
|---|---|
| Photosensitive solution 2A | |
| Copolymer 1 | 0.75 g |
| Cyanine Dye A | 0.04 g |
| p-Toluenesulfonic acid | 0.002 g |
| Tetrahydrophthalic anhydride | 0.05 g |

-continued

| | |
|---|---|
| Victoria Pure Blue BOH having 1-naphthalenesulfonic acid anion as the coutner anion | 0.015 g |
| Fluorine-containing polymer (Megafac F-176 (20%), manufactured by Dainippon Ink & Chemicals Inc.) | 0.01 g |
| γ-Butyrolactone | 8 g |
| Methyl ethyl ketone | 7 g |
| 1-Methoxy-2-propanol | 7 g |
| Photosensitive solution 2B | |
| Novolak resin (weight average molecular weight: 4,500, unreacted cresol: 0.5 wt %) | 0.25 g |
| Polymer according to the present invention | shown in Table I-1 |
| Cyanine Dye A | 0.05 g |
| n-Dodecyl stearate | 0.02 g |
| Fluorine-containing polymer (Megafac F-176 (20%), manufactured by Dainippon Ink & Chemicals Inc.) | 0.015 g |
| Fluorine-containing polymer (Megafac MCF-312 (30%), manufactured by Dainippon Ink & Chemicals Inc.) | 0.03 g |
| Methyl ethyl ketone | 7 g |
| 1-Methoxy-2-propanol | 7 g |

Synthesis of Copolymer 1

Thirty-one point zero (31.0) grams (0.36 mol) of methacrylic acid, 39.1 g (0.36 mol) of ethyl chloroformate, and 200 ml of acetonitrile were put in a three-neck flask equipped with a stirrer, a cooling pipe and a dropping funnel having a capacity of 500 ml, and the mixture was stirred with cooling in a ice water bath. To the mixture was dropwise added 36.4 g (0.36 mol) of triethylamine by means of a dropping funnel over about 1 hour. After termination of the dropping addition, the ice water bath was taken out and the mixture was stirred at room temperature for 30 minutes.

To the reaction mixture, 51.7 g (0.30 mol) of p-aminobenzenesulfonamide was added and the mixture was stirred with heating at 70° C. in an oil bath for 1 hour. After completion of the reaction, the mixture was poured into 1 liter of water with stirring the water, and stirring of the mixture was continued for 30 minutes. The mixture was filtered and the precipitate was taken out, the precipitate was made slurry with 500 ml of water. The slurry was filtered to thereby obtain a solid, and a white solid of N-(p-aminosulfonylphenyl)methacrylamide was obtained by drying the obtained solid (yield: 46.9 g).

Four point six one (4.61) grams (0.0192 mol) of N-(p-aminosulfonylphenyl)methacrylamide, 2.58 g (0.0258 mol) of ethyl methacrylate, 0.80 g (0.015 mol) of acrylonitrile, and 20 g of N,N-dimethylacetamide were put in a three-neck flask equipped with a stirrer, a cooling pipe and a dropping funnel having a capacity of 20 ml, and the mixture was stirred with heating at 65° C. in a hot water bath. To the mixture was added 0.15 g of "V-65" (a product of Wako Pure Chemical Co., Ltd.) and the mixture was stirred in nitrogen air flow for 2 hours with maintaining the temperature at 65° C. A mixture comprising 4.61 g of N-(p-aminosulfonylphenyl)methacrylamide, 2.58 g of methyl methacrylate, 0.80 g of acrylonitrile, N,N-dimethylacetamide and 0.15 g of "V-65" was further dropwise added to the reaction mixture by means of a dropping funnel over 2 hours. After termination of the dropwise addition, the reaction mixture obtained was stirred for further 2 hours at 65° C. After completion of the reaction, 40 g of methanol was added to the mixture and cooled. The mixture obtained was poured into 2 liters of water with stirring the water and stirring of the mixture was continued for 30 minutes. The precipitate was filtered and dried, thereby 15 g of a white solid was obtained.

This specific Copolymer 1 was found to have a weight average molecular weight (in terms of polystyrene) of 53,000 on measurement by gel permeation chromatography.

Evaluation of Development Latitude

A test pattern was imagewise drawn on the obtained lithographic printing plate precursor by using Trendsetter (manufactured by Creo Co.) at a beam intensity of 9 w and a drum rotation speed of 150 rpm.

The exposed lithographic printing plate precursor on the above condition was subjected to development by PS processor 900 H (manufactured by Fuji Photo Film Co., Ltd.) charged with alkali developing solution A having the composition shown below with maintaining the liquid temperature at 30° C. for 20 seconds.

After that, processing was repeated with gradually diluting the developing solution with water. Whether or not there were staining and coloring attributable to the residual film of the recording layer due to development failure was observed, and the electrical conductance of the developing solution which resulted in good development was measured.

The results obtained are shown in Table I-1 below. The developing solution whose difference between the upper limit value and the lower limit value was great was evaluated as excellent in development latitude.

Composition of Alkali Developing Solution A

| | |
|---|---|
| $SiO_2.K_2O$ ($K_2O/SiO_2$ = 1/1 (molar ratio)) | 4.0 mass % |
| Citric acid | 0.5 mass % |
| Polyethylene glycol lauryl ether (weight average molecular weight: 1,000) | 0.5 mass % |
| Water | 95.0 mass % |

TABLE I-1

| Example No. | Polymer | Addition Amount (g) | Development Latitude (ms/cm) | | |
|---|---|---|---|---|---|
| | | | Upper Limit | Lower Limit | Δ |
| Example I-1 | 1 | 0.10 | 78 | 66 | 12 |
| Example I-2 | 2 | 0.08 | 80 | 68 | 12 |
| Example I-3 | 3 | 0.15 | 78 | 68 | 10 |
| Example I-4 | 4 | 0.20 | 76 | 66 | 10 |
| Example I-5 | 5 | 0.15 | 78 | 66 | 12 |
| Example I-6 | 6 | 0.10 | 78 | 68 | 10 |
| Example I-7 | 7 | 0.05 | 76 | 66 | 10 |
| Example I-8 | 1 | 0.10 | 52 | 40 | 12 |
| Example I-9 | 2 | 0.08 | 50 | 38 | 12 |
| Example I-10 | 3 | 0.15 | 52 | 38 | 14 |
| Example I-11 | 4 | 0.20 | 54 | 40 | 14 |
| Example I-12 | 5 | 0.15 | 50 | 36 | 14 |
| Example I-13 | 6 | 0.10 | 52 | 40 | 12 |
| Example I-14 | 7 | 0.05 | 52 | 38 | 14 |
| Comparative Example I-1 | (A-1)/Methyl methacrylate (30/70) | 0.10 | 78 | 74 | 4 |
| Comparative Example I-2 | — | — | 72 | 70 | 2 |
| Comparative Example I-3 | (A-1)/Methyl methacrylate (30/70) | 0.10 | 52 | 48 | 4 |
| Comparative Example I-4 | — | — | 44 | 40 | 4 |

The compositions of the polymers in Table I-1 are shown by molar ratio.

The structural formulae of the polymers in Table I-1 are shown below.

TABLE I-2

| Polymer According to the Present Invention | Alkylene Oxide-Containing Monomer | | Acid Group-Containing Monomer | | Other Monomer | |
|---|---|---|---|---|---|---|
| | Structural Formula | Mol % | Structural Formula | Mol % | Structure | Mol % |
| 1 | (1) | 30 | (A-1) | 30 | — | 40 |
| 2 | (2) | 40 | (A-1) | 25 | Methyl methacrylate | 35 |
| 3 | (3) | 20 | (A-2) | 40 | n-Butyl methacrylate | 40 |
| 4 | (4) | 50 | (A-2) | 20 | Benzyl acrylate | 30 |
| 5 | (6) | 33 | (A-3) | 33 | 1-Butyl methacrylamide | 34 |
| 6 | (7) | 25 | (A-4) | 35 | Methacrylamide | 40 |
| 7 | (13) | 15 | (A-5) | 30 | Styrene | 55 |

Acid-containing monomers (A-1) to (A-5) are shown below.

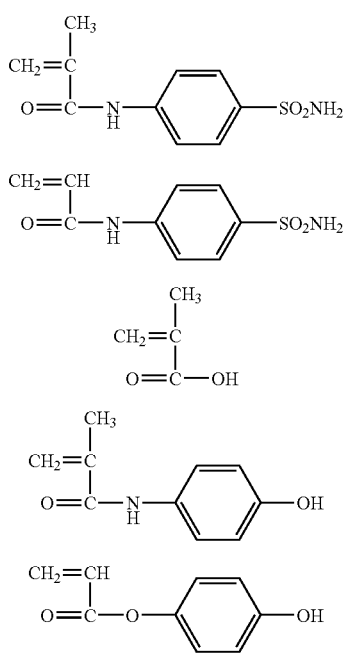

It can be seen from the results shown in Table I-1 that excellent development latitude can be realized by applying the infrared-sensitive photosensitive composition according to the present invention to the image-forming layer of a lithographic printing plate precursor.

Examples II-1 to II-6 and Comparative Examples II-1 to II-3

Formation of Support

A JIS A 1050 aluminum sheet was subjected to surface graining treatment with a rotary nylon brush and a suspension of pumice stone and water as the abrasive. Surface roughness (central line average surface roughness) at this time was 0.5 μm. After washing with water, the sheet was immersed in a 10% sodium hydroxide aqueous solution heated at 70° C. and etching was performed so that the dissolving amount of the aluminum reached 6 g/m². After washing with water, the sheet was immersed in a 30% nitric acid aqueous solution for 1 minute to be neutralized, and then thoroughly washed with water. Subsequently, the sheet was subjected to electrolytic surface roughening treatment in a 0.7% nitric acid aqueous solution using rectangular alternating wave form voltage of the anode time voltage of 13 V and the cathode time voltage of 6 V for 20 seconds. The surface of the sheet was washed by immersion in a 20% sulfuric acid solution at 50° C., and then washed with water.

The surface-roughened aluminum sheet was subjected to porous anodic oxide film-forming treatment in a 20% sulfuric acid aqueous solution using direct current. Electrolysis was conducted at electric current density of 5 A/dm² and a substrate having an anodic oxide film having a weight of 4.0 g/m² was formed on the surface by controlling the electrolysis time. The substrate was treated in a saturated steam chamber at 100° C., 1 atm. for 10 seconds, thereby Substrate (a) having a sealing rate of 60% was obtained.

Substrate (a) was subjected to the treatment of surface-hydrophilization in a 2.5 wt % aqueous solution of sodium silicate at 30° C. for 10 seconds, and then a subbing layer coating solution having the composition shown below was coated on Substrate (a) and the coated layer was dried at 80° C. for 15 seconds, thereby Support [A] for a lithographic printing plate was obtained. The dry coating weight was 15 mg/m².

Subbing Layer Coating Solution

| Copolymer having a molecular weight of 28,000 shown below | 0.3 g |
|---|---|

$-(CH_2-CH)_{85}-$ (phenyl-COOH)  $-(CH_2-CH)_{15}-$ (phenyl-$CH_2N^+Et_3\ Cl^-$)

molecular weight: 28,000

| Methanol | 100 g |
|---|---|
| Water | 1 g |

Formation of Recording Layer

Photosensitive solution 1 having the composition shown below was coated on Support [A] having the subbing layer in a coating amount of 1.8 g/m² and the coated layer was dried to form a photosensitive layer (a recording layer), thereby lithographic printing plate Precursor 1 was obtained.

Photosensitive Solution 1

| | |
|---|---|
| Novolak resin | 1.0 g |
| (m/p-cresol (6/4), weight average molecular weight: 7,000, unreacted cresol: 0.5 wt %) | |
| Polyurethane resin | shown in Table II-5 |
| Cyanine Dye A having the following structural formula | 0.1 g |

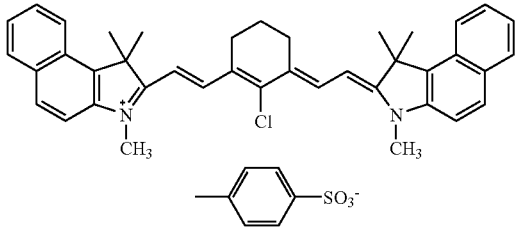

| | |
|---|---|
| Phthalic anhydride | 0.05 g |
| p-Toluenesulfonic acid | 0.002 g |
| Ethyl Violet having 6-hydroxy-β-naphthalene sulfonic acid as the counter ion | 0.02 g |
| Fluorine-containing polymer (Megafac F-176 (solid content: 20%), manufactured by Dainippon Ink & Chemicals Inc.) | 0.015 g |
| Fluorine-containing polymer (Megafac MCF-312 (solid content: 30%), manufactured by Dainippon Ink & Chemicals Inc.) | 0.035 g |
| Methyl ethyl ketone | 12 g |

Evaluation of Development Latitude

A test pattern was imagewise drawn on the obtained lithographic printing plate precursor by using Trendsetter (manufactured by Creo Co.) at a beam intensity of 9 w and a drum rotation speed of 150 rpm.

The exposed lithographic printing plate precursor on the above condition was subjected to development by PS processor 900 H (manufactured by Fuji Photo Film Co., Ltd.) charged with alkali developing solution A having the composition shown below with maintaining the liquid temperature at 30° C. for 20 seconds.

After that, processing was repeated with gradually diluting the developing solution with water. Whether or not there were staining and coloring attributable to the residual film of the recording layer due to development failure was observed. Processing was further repeated with diluting the developing solution with water, and the electrical conductance of the developing solution capable of effecting development was measured.

The results obtained are shown in Table II-5 below. The developing solution whose difference between the upper limit value and the lower limit value was great was evaluated as excellent in development latitude.

Composition of Alkali Developing Solution A

| | |
|---|---|
| SiO₂·K₂O (K₂O/SiO₂ = 1/1 (molar ratio)) | 4.0 mass % |
| Citric acid | 0.5 mass % |
| Polyethylene glycol lauryl ether | 0.5 mass % |

-continued

| | |
|---|---|
| (weight average molecular weight: 1,000) | |
| Water | 50.0 mass % |

TABLE II-5

| Example No. | Addition Polyurethane Resin | Amount (g) | Development Latitude (ms/cm) Upper Limit | Lower Limit | Δ |
|---|---|---|---|---|---|
| Example II-1 | a | 0.05 | 78 | 64 | 14 |
| Example II-2 | b | 0.08 | 80 | 66 | 14 |
| Example II-3 | c | 0.06 | 78 | 66 | 12 |
| Example II-4 | d | 0.06 | 78 | 66 | 12 |
| Example II-5 | e | 0.08 | 80 | 66 | 14 |
| Example II-6 | f | 0.10 | 78 | 66 | 12 |
| Comparative Example II-1 | g | 0.06 | 76 | 72 | 4 |
| Comparative Example II-2 | h | 0.06 | 78 | 74 | 4 |
| Comparative Example II-3 | — | — | 72 | 70 | 2 |

It can be seen from the results shown in Table II-5 that excellent development latitude can be realized by applying the infrared-sensitive photosensitive composition according to the present invention to the image-forming layer of a lithographic printing plate precursor.

Examples II-7 to II-12 and Comparative Examples II-4 to II-6

Photosensitive solution 2A having the composition shown below was coated on the same Support [A] as used in Example 1 and the coated layer was dried at 100° C. for 2 minutes, thereby Layer (A) was formed. The dry coating weight was 1.04 g/m².

Photosensitive solution 2B having the composition shown below was coated thereon and dried at 100° C. for 2 minutes to form Layer (B) (the upper layer), thereby lithographic printing plate Precursor 2 was formed. The total dry coating amount of the photosensitive layers was 1.2 g/m².

| Photosensitive solution 2A | |
|---|---|
| Copolymer 1 (described in detail below) | 0.75 g |
| Polyurethane resin | shown in Table II-6 |
| Cyanine Dye A | 0.04 g |
| p-Toluenesulfonic acid | 0.002 g |
| Tetrahydrophthalic anhydride | 0.05 g |
| Victoria Pure Blue BOH having 1-naphthalenesulfonic acid anion as the coutner anion | 0.015 g |
| Fluorine-containing polymer (Megafac F-176 (solid content: 20%), manufactured by Dainippon Ink & Chemicals Inc.) | 0.010 g |
| γ-Butyrolactone | 8 g |
| Methyl ethyl ketone | 7 g |
| 1-Methoxy-2-propanol | 7 g |
| Photosensitive solution 2B | |
| Novolak resin | 0.25 g |
| (m/p-cresol (6/4), weight average molecular weight: 4,500, unreacted cresol: 0.5 wt %) | |
| Polyurethane resin | shown in Table II-6 |

-continued

| | |
|---|---|
| Cyanine Dye A | 0.05 g |
| n-Dodecyl stearate | 0.02 g |
| Fluorine-containing polymer (Megafac 780-F (solid content: 30%), manufactured by Dainippon Ink & Chemicals Inc.) | 0.010 g |
| Fluorine-containing polymer (Megafac MCF-770-F (solid content: 10%), manufactured by Dainippon Ink & Chemicals Inc.) | 0.100 g |
| Methyl ethyl ketone | 7 g |
| 1-Methoxy-2-propanol | 7 g |

Synthesis of Copolymer 1

Thirty-one point zero (31.0) grams (0.36 mol) of methacrylic acid, 39.1 g (0.36 mol) of ethyl chloroformate, and 200 ml of acetonitrile were put in a three-neck flask equipped with a stirrer, a cooling pipe and a dropping funnel having a capacity of 500 ml, and the mixture was stirred with cooling in a ice water bath. To the mixture was dropwise added 36.4 g (0.36 mol) of triethylamine by means of a dropping funnel over about 1 hour. After termination of the dropping addition, the ice water bath was taken out and the mixture was stirred at room temperature for 30 minutes.

To the reaction mixture, 51.7 g (0.30 mol) of p-aminobenzenesulfonamide was added and the mixture was stirred with heating at 70° C. in an oil bath for 1 hour. After completion of the reaction, the mixture was poured into 1 liter of water with stirring the water, and stirring of the mixture was continued for 30 minutes. The mixture was filtered and the precipitate was taken out, the precipitate was made slurry with 500 ml of water. The slurry was filtered to thereby obtain a solid, and a white solid of N-(p-aminosulfonylphenyl)methacrylamide was obtained by drying the obtained solid (yield: 46.9 g).

Four point six one (4.61) grams (0.0192 mol) of N-(p-aminosulfonylphenyl)methacrylamide, 2.58 g (0.0258 mol) of ethyl methacrylate, 0.80 g (0.015 mol) of acrylonitrile, and 20 g of N,N-dimethylacetamide were put in a three-neck flask equipped with a stirrer, a cooling pipe and a dropping funnel having a capacity of 20 ml, and the mixture was stirred with heating at 65° C. in a hot water bath. To the mixture was added 0.15 g of "V-65" (a product of Wako Pure Chemical Co., Ltd.) and the mixture was stirred in nitrogen air flow for 2 hours with maintaining the temperature at 65° C. A mixture comprising 4.61 g of N-(p-aminosulfonylphenyl)methacrylamide, 2.58 g of methyl methacrylate, 0.80 g of acrylonitrile, N,N-dimethylacetamide and 0.15 g of "V-65" was further dropwise added to the reaction mixture by means of a dropping funnel over 2 hours. After termination of the dropwise addition, the reaction mixture obtained was stirred for further 2 hours at 65° C. After completion of the reaction, 40 g of methanol was added to the mixture and cooled. The mixture obtained was poured into 2 liters of water with stirring the water and stirring of the mixture was continued for 30 minutes. The precipitate was filtered and dried, thereby 15 g of a white solid was obtained.

This specific Copolymer 1 was found to have a weight average molecular weight (in terms of polystyrene) of 53,000 on measurement by gel permeation chromatography.

Evaluation of Development Latitude

A test pattern was imagewise drawn on the obtained lithographic printing plate precursor by using Trendsetter (manufactured by Creo Co.) at a beam intensity of 9 w and a drum rotation speed of 150 rpm.

The exposed lithographic printing plate precursor on the above condition was subjected to development by PS processor 900 H (manufactured by Fuji Photo Film Co., Ltd.) charged with alkali developing solution A having the composition shown below with maintaining the liquid temperature at 30° C. for 20 seconds.

After that, processing was repeated with gradually diluting the developing solution with water. Whether or not there were staining and coloring attributable to the residual film of the recording layer due to development failure was observed. Processing was further repeated with diluting the developing solution with water, and the electrical conductance of the developing solution capable of effecting development was measured.

The results obtained are shown in Table II-6 below. The developing solution whose difference between the upper limit value and the lower limit value was great was evaluated as excellent in development latitude.

Composition of Alkali Developing Solution A

| | |
|---|---|
| $SiO_2.K_2O$ ($K_2O/SiO_2$ = 1/1 (molar ratio)) | 4.0 mass % |
| Citric acid | 0.5 mass % |
| Polyethylene glycol lauryl ether (weight average molecular weight: 1,000) | 0.5 mass % |
| Water | 50.0 mass % |

TABLE II-6

| | Polyurethane Resin | | Addition Amount (g) | | Development Latitude (ms/cm) | | |
|---|---|---|---|---|---|---|---|
| Example No. | 2A | 2B | 2A | 2B | Upper Limit | Lower Limit | Δ |
| Example II-7 | a | — | 0.05 | — | 52 | 38 | 14 |
| Example II-8 | b | — | 0.04 | — | 50 | 36 | 14 |
| Example II-9 | c | — | 0.08 | — | 52 | 38 | 14 |
| Example II-10 | — | d | — | 0.02 | 54 | 38 | 16 |
| Example II-11 | e | e | 0.04 | 0.03 | 52 | 36 | 16 |
| Example II-12 | f | — | 0.06 | — | 52 | 40 | 12 |
| Comparative Example II-4 | g | — | 0.06 | — | 50 | 46 | 4 |
| Comparative Example II-5 | — | h | — | 0.02 | 52 | 48 | 4 |
| Comparative Example II-6 | — | — | — | — | 44 | 40 | 4 |

It can be seen from the results shown in Table II-6 that excellent development latitude can be realized by applying the infrared-sensitive photosensitive composition according to the present invention to the image-forming layer of a lithographic printing plate precursor.

EFFECT OF THE INVENTION

The present invention can provide an infrared-sensitive photosensitive composition for use as the image-forming layer of a lithographic printing plate precursor which is excellent in processability (development latitude) even when processed with a fatigued developing solution lowered in activity.

The entitle disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. An infrared-sensitive photosensitive composition comprising:
   (A) an alkali-soluble resin containing a repeating unit having an alkylene oxide group, and a repeating unit containing an acid group, and
   (B) a light-to-heat converting agent,
   wherein the acid group is selected from the group consisting of a phenolic hydroxyl group, a sulfonamido group, an active imido group, a carboxylic acid group soluble in an aqueous alkali, a sulfonic acid group soluble in an aqueous alkali and a phosphoric acid group soluble in an aqueous alkali.

2. An infrared-sensitive photosensitive composition comprising:
   (A') a polyurethane resin comprising at least the reaction product of a diisocyanate compound and a diol compound represented by the following formula (II) or (III) as a constituent:

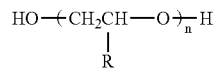  (II)

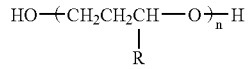  (III)

wherein R represents a hydrogen atom or an alkyl group having from 1 to 8 carbon atoms; and n represents an integer of 2 or higher,
   (B) a light-to-heat converting agent, and
   (C) a novolak resin.

3. The infrared-sensitive positive photosensitive composition according to claim 2, wherein the diisocyanate compound is a compound represented by the following formula (IV):

OCN—R$^1$—NCO     (IV)

wherein R$^1$ represents a divalent aliphatic or aromatic hydrocarbon which may have a substituent.

* * * * *